US010727826B2

(12) United States Patent
Choi et al.

(10) Patent No.: US 10,727,826 B2
(45) Date of Patent: Jul. 28, 2020

(54) DELAY-LOCKED LOOP CIRCUIT, SEMICONDUCTOR MEMORY DEVICE, AND METHODS OF OPERATING DELAY-LOCKED LOOP CIRCUIT

(71) Applicant: SAMSUNG ELECTRONICS CO., LTD., Suwon-si, Gyeonggi-do (KR)

(72) Inventors: Hun-Dae Choi, Hwaseong-si (KR); Hwa-Pyong Kim, Uijeongbu-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/282,870

(22) Filed: Feb. 22, 2019

(65) Prior Publication Data

US 2020/0059226 A1 Feb. 20, 2020

(30) Foreign Application Priority Data

Aug. 14, 2018 (KR) .................. 10-2018-0094830

(51) Int. Cl.
| | |
|---|---|
| *H03K 5/156* | (2006.01) |
| *G11C 11/4076* | (2006.01) |
| *H03L 7/081* | (2006.01) |
| *H03L 7/089* | (2006.01) |

(Continued)

(52) U.S. Cl.
CPC ........ *H03K 5/1565* (2013.01); *G11C 11/4076* (2013.01); *G11C 11/4093* (2013.01); *H03L 7/0807* (2013.01); *H03L 7/0812* (2013.01); *H03L 7/0895* (2013.01)

(58) Field of Classification Search
CPC ............. H03K 5/1565; G11C 11/4076; G11C 11/4093; H03L 7/0807; H03L 7/0812; H03L 7/0895

See application file for complete search history.

(56) References Cited

U.S. PATENT DOCUMENTS

| 7,057,431 B2 | 6/2006 | Kwak |
| 7,385,428 B2 | 6/2008 | Lee et al. |

(Continued)

FOREIGN PATENT DOCUMENTS

| JP | 2009-044579 A | 2/2009 |
| KR | 10-2012-0027850 A | 3/2012 |

(Continued)

*Primary Examiner* — Tri M Hoang
(74) *Attorney, Agent, or Firm* — Lee IP Law, PC

(57) ABSTRACT

A delay-locked loop circuit includes first and second duty cycle correctors, and first and second duty cycle detectors. The first duty cycle corrector adjusts duties of some of first through fourth divided clock signals to provide first through fourth corrected clock signals, in response to a first correction code. The second duty cycle corrector adjusts delays of some of second through fourth delayed clock signals to provide first through fourth source clock signals, in response to a second correction code. The first duty cycle detector detects a duty of first propagation clock signal to generate a first sub-correction code of the first correction code, and duties of first and second recovered clock signals to generate the second correction code. The second duty cycle detector detects a duty of second propagation clock signal to generate a second sub-correction code of the first correction code.

20 Claims, 20 Drawing Sheets

(51) Int. Cl.
  *H03L 7/08* (2006.01)
  *G11C 11/4093* (2006.01)

(56) References Cited

U.S. PATENT DOCUMENTS

| | | | |
|---|---|---|---|
| 7,649,389 B2 * | 1/2010 | Bae | H03L 7/0812 |
| | | | 327/149 |
| 7,719,921 B2 | 5/2010 | Kuroki et al. | |
| 7,839,194 B2 | 11/2010 | Chang et al. | |
| 7,840,831 B2 | 11/2010 | Jang | |
| 8,072,253 B2 * | 12/2011 | Kaeriyama | G06F 1/08 |
| | | | 327/231 |
| 8,432,193 B2 | 4/2013 | Marutani | |
| 8,542,045 B2 | 9/2013 | Na et al. | |
| 9,501,041 B2 | 11/2016 | Shim et al. | |
| 9,654,093 B2 | 5/2017 | Yun et al. | |
| 9,818,462 B1 * | 11/2017 | Polney | G11C 7/1084 |
| 2007/0076832 A1 * | 4/2007 | Matsudera | H03L 7/18 |
| | | | 375/371 |
| 2017/0279441 A1 | 9/2017 | Adachi | |
| 2018/0090186 A1 * | 3/2018 | Kang | H04L 7/10 |
| 2018/0336937 A1 * | 11/2018 | Yoon | G11C 7/1066 |

FOREIGN PATENT DOCUMENTS

| KR | 10-2016-0042496 A | 4/2016 |
|---|---|---|
| KR | 10-2016-0065516 A | 6/2016 |

* cited by examiner

DELAY-LOCKED LOOP CIRCUIT, SEMICONDUCTOR MEMORY DEVICE, AND METHODS OF OPERATING DELAY-LOCKED LOOP CIRCUIT

CROSS-REFERENCE TO RELATED APPLICATION

Korean Patent Application No. 10-2018-0094830, filed on Aug. 14, 2018, in the Korean Intellectual Property Office, and entitled: "Delay-Locked Loop Circuit, Semiconductor Memory Device, and Methods of Operating Delay-Locked Loop Circuit," is incorporated by reference herein in its entirety.

BACKGROUND

1. Field

The present disclosure relates to memories, and more particularly to delay-loop circuits, semiconductor memory devices and method of operating delay-loop circuits in semiconductor memory devices.

2. Description of the Related Art

Generally, semiconductor devices transmit or receive data therebetween at a high speed in synchronization with a clock signal. A duty cycle corrector (DCC) for adjusting a duty (i.e., duty cycle) of a clock signal to about 50% may be used for enhancing the characteristic of the clock signal supplied to a semiconductor device.

Recently, semiconductor memory devices operating at a high speed divide an external clock signal and use divided clock signals for solving a frequency limit of a core circuit in the semiconductor memory device.

SUMMARY

According to example embodiments, a delay-locked loop (DLL) circuit of a semiconductor memory device includes a first duty cycle corrector, a second duty cycle corrector, a clock tree, a first duty cycle detector and a second duty cycle detector. The first duty cycle corrector adjusts duties of at least some of first through fourth divided clock signals to provide first through fourth corrected clock signals, in response to first correction codes, have multi-phases and have a phase difference of 90 degrees with respect to each other. The second duty cycle corrector adjusts delays of at least some of second through fourth delayed clock signals of first through fourth delayed clock signals to provide first through fourth source clock signals, in response to a second correction code. The clock tree provides the first through fourth source clock signals to an inside of the semiconductor memory device as first through propagation clock signals. The first duty cycle detector detects a duty of the first propagation clock signal to generate a first sub correction code of the first correction codes and detects duties of first and second recovered clock signals to generate the second correction code. The second duty cycle detector detects a duty of the second propagation clock signal to generate a second sub correction code of the first correction codes.

According to example embodiments, a semiconductor memory device includes a DLL circuit, a memory cell array, and a data input/output buffer. The DLL circuit receives a reference clock signal, and corrects duty cycle errors of first through fourth divided clock signals to provide an output clock signal synchronized with the reference clock signal. The first through fourth divided clock signals are generated by dividing the reference clock signal. The memory cell array includes a plurality of dynamic memory cells. The data input/output buffer stores data read from the memory cell array and outputs the data in synchronization with the output clock signal. The DLL circuit includes a first duty cycle corrector, a second duty cycle corrector, a clock tree, a first duty cycle detector and a second duty cycle detector. The first duty cycle corrector adjusts duties of at least some of the first through fourth divided clock signals to provide first through fourth corrected clock signals, in response to first correction codes, have multi-phases and have a phase difference of 90 degrees with respect to each other. The second duty cycle corrector adjusts delays of at least some of second through fourth delayed clock signals of first through fourth delayed clock signals to provide first through fourth source clock signals, in response to a second correction code. The clock tree provides the first through fourth source clock signals to an inside of the semiconductor memory device as first through propagation clock signals. The first duty cycle detector detects a duty of the first propagation clock signal to generate a first sub correction code of the first correction codes and detects duties of first and second recovered clock signals to generate the second correction code. The second duty cycle detector detects a duty of the second propagation clock signal to generate a second sub correction code of the first correction codes.

According to example embodiments, in a method of operating a DLL circuit, first through fourth divided clock signals which have a phase difference of 90 degrees with respect to each other are generated based on a reference clock signal. Duties of first and second propagation clock signals are detected based on the first and second divided clock signals to adjust slopes of edges of the first and second divided clock signals. A recovered clock signal is generated based on the first through fourth divided clock signals. A duty of recovered clock signal is detected to adjust a skew between the first and second divided clock signals.

BRIEF DESCRIPTION OF THE DRAWINGS

Features will become apparent to those of skill in the art by describing in detail exemplary embodiments with reference to the attached drawings in which.

DETAILED DESCRIPTION

Various example embodiments will be described more fully hereinafter with reference to the accompanying drawings, in which example embodiments are shown.

Figure 1:
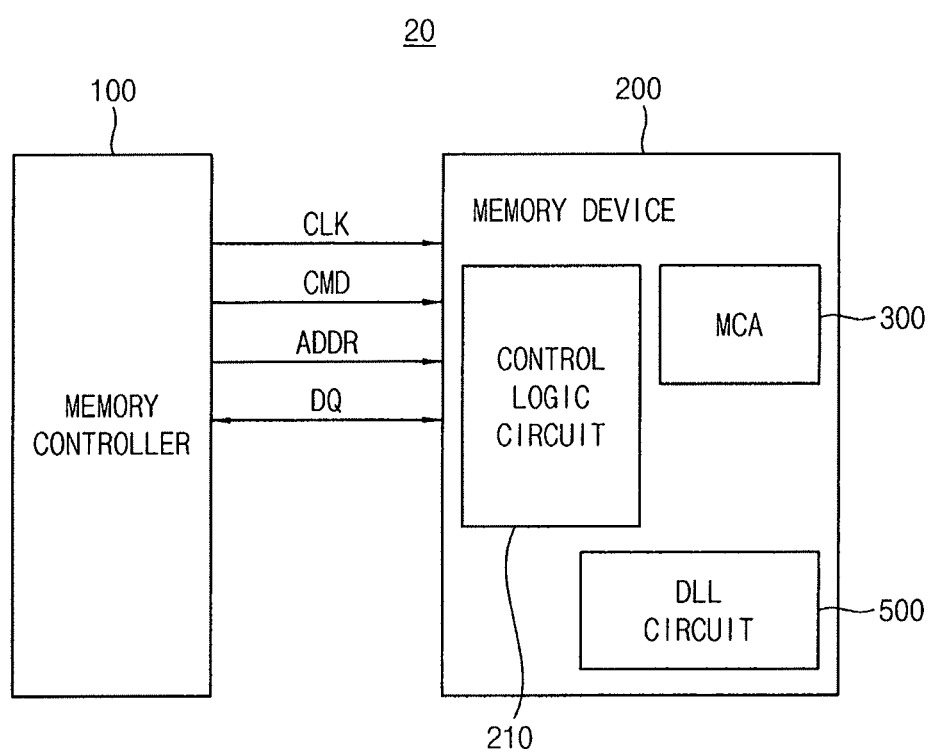
FIG. 1 illustrates a memory system according to example embodiments.

FIG. 1 illustrates a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

In some example embodiments, the semiconductor memory device 200 is a memory device including dynamic memory cells, e.g., a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command signal CMD, and an address (signal) ADDR to the semiconductor memory device 200, and exchanges data DQ with the semiconductor memory device 200.

The semiconductor memory device 200 includes a memory cell array (MCA) 300 that stores the data DQ, a control logic circuit 210, and a delay-locked loop (DLL) circuit 500. The DLL circuit 500 corrects duty cycle errors of first through fourth divided clock signals, which are generated by dividing a reference clock signal, to generate an output clock signal which is synchronized with the reference clock signal. The control logic circuit 210 controls an access to the memory cell array 300 based on the command CMD the address ADDR and controls an operation of the DLL circuit 500.

Figure 2:
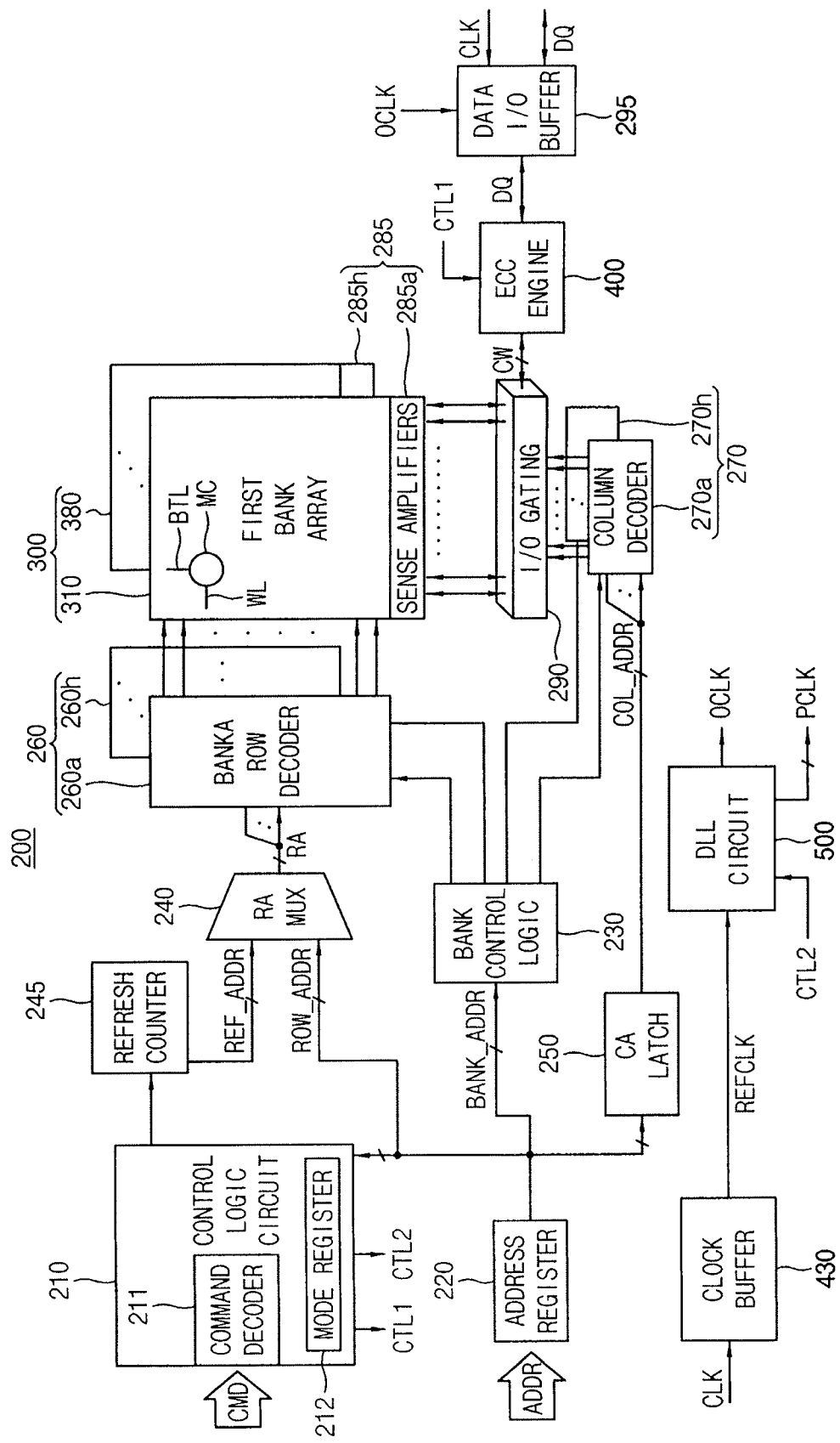
FIG. 2 illustrates a semiconductor memory device in FIG. 1 according to example embodiments.

FIG. 2 illustrates a semiconductor memory device in FIG. 1 according to example embodiments. Referring to FIG. 2, the semiconductor memory device 200 includes the control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit 290, an error correction code (ECC) engine 400, a clock buffer 430, the DLL circuit 500, and a data I/O buffer 295.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC formed at intersections of a plurality of word-lines WL and a plurality of bit-line BTL.

The address register 220 receives the address ADDR, including a bank address BANK_ADDR, a row address ROW_ADDR, and a column address COL_ADDR, from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address (RA) multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA output from the row address multiplexer 240 is applied to the first through eighth bank row decoders 260a~260h.

The refresh counter 245 may sequentially output the refresh row address REF_ADDR under control of the control logic circuit 210 to the row address multiplexer 240.

One of the first through eighth bank row decoders 260a~260h activated by the bank control logic 230 decodes the row address RA output from the row address multiplexer 240, and activates a word-line corresponding to the row address RA. For example, the activated bank row decoder applies a word-line driving voltage to the word-line corresponding to the row address.

The column address (CA) latch 250 receives the column address COL_ADDR from the address register 220 and temporarily stores the received column address COL_ADDR. In some embodiments, in a burst mode, the column address latch 250 generates column addresses that increment, e.g., increase in a stepwise manner, from the received column address COL_ADDR. The column address latch 250 applies the temporarily stored or generated column address to the first through eighth bank column decoders 270a~270h.

The activated bank row decoder of the first through eighth bank column decoders 270a~270h activates a sense amplifier of the sense amplifiers 285a~285h corresponding to the bank address BANK_ADDR and the column address COL_ADDR through the I/O gating circuit 290.

The I/O gating circuit 290 includes a circuitry for gating input/output data, and further includes input data mask logic, read data latches for storing data output from the first through eighth bank arrays 310~380, and write drivers for writing data to the first through eighth bank arrays 310~380.

Codeword CW read from one bank array of the first through eighth bank arrays 310~380 is sensed by a corresponding sense amplifier coupled to the one bank array from which the data is to be read, and is stored in the read data latches in the I/O gating circuit 290. The codeword CW stored in the read data latches may be provided to the ECC engine 400 to ECC decode the codeword CW and, then, is output to the memory controller 100 via the data I/O buffer 295.

The data DQ to be written in one bank array of the first through eighth bank arrays 310~380 may be provided to the data I/O buffer 295 from the memory controller 100, may be provided to the ECC engine 400 from the data I/O buffer 295, the ECC engine 400 may perform an ECC encoding on the data DQ to generate parity bits, the ECC engine 400 may provide the data DQ and the parity bits to the I/O gating circuit 290, and the I/O gating circuit 290 may write the data DQ and the parity bits in a sub-page in one bank array through the write drivers.

The data I/O buffer 295 may provide the data DQ from the memory controller 100 to the ECC engine 400 in a write operation of the semiconductor memory device 200, based on the clock signal CLK and may provide the data DQ from the ECC engine 400 to the memory controller 100 in a read operation of the semiconductor memory device 200 based on an output clock signal OCLK provided from the DLL circuit 500. The ECC engine 400 may perform an ECC encoding and an ECC decoding on the data DQ based on a first control signal CTL1 from the control logic circuit 210.

A clock buffer 430 receives the clock signal CLK to provide a reference clock signal REFCLK. The DLL circuit 500 may receive the reference clock signal REFCLK from the clock buffer 430, may correct duty cycle errors of the first through fourth divided clock signals, generated by dividing the reference clock signal REFCLK and have a phase difference of 90 degrees with respect to each other, to generate propagation clock signals, and may generate the output clock signal OCLK having the same frequency as the reference clock signal REFCLK. The DLL circuit 500 may provide the output clock signal OCLK to the data I/O buffer 295 and output propagation clock signals PCLK. The DLL circuit 500 may operate in response to a second control signal CTL2 from the control logic circuit 210.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate the first control signal CTL1 to control the ECC engine 400, and the second control signal CTL2 to control the DLL circuit 500.

Figure 3:
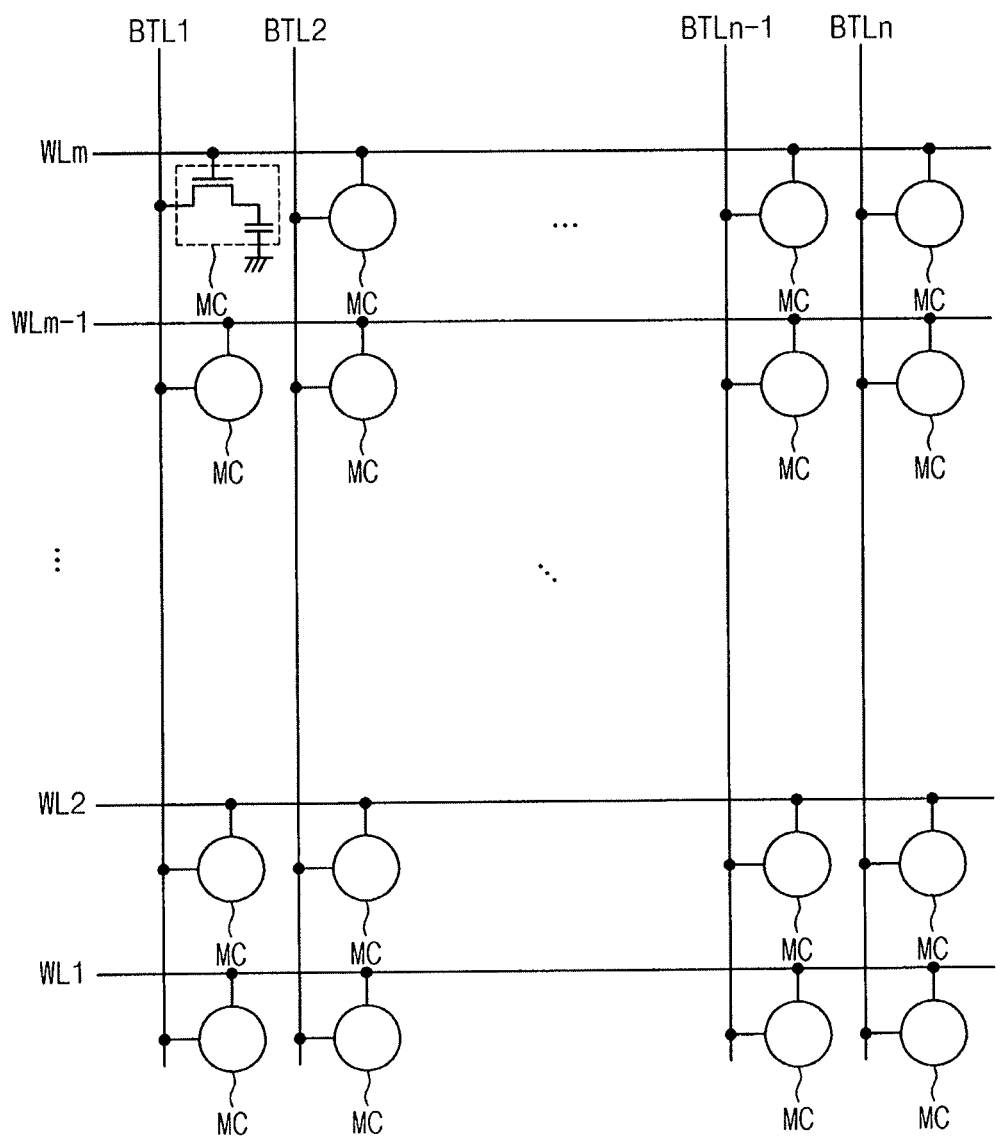
FIG. 3 illustrates an example of the first bank array in the semiconductor memory device of FIG. 2.

FIG. 3 illustrates an example of the first bank array in the semiconductor memory device of FIG. 2. Referring to FIG. 3, the first bank array 310 includes a plurality of word-lines WL1~WLm (m is a natural number greater than two), a plurality of bit-lines BTL1~BTLn (n is a natural number greater than two), and a plurality of memory cells MCs at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor. For example, each cell transistor may include a gate electrode connected to a word line, a first electrode connected to a bit line, and a second electrode connected to a cell capacitor, which, in turn is connected to ground.

Figure 4:
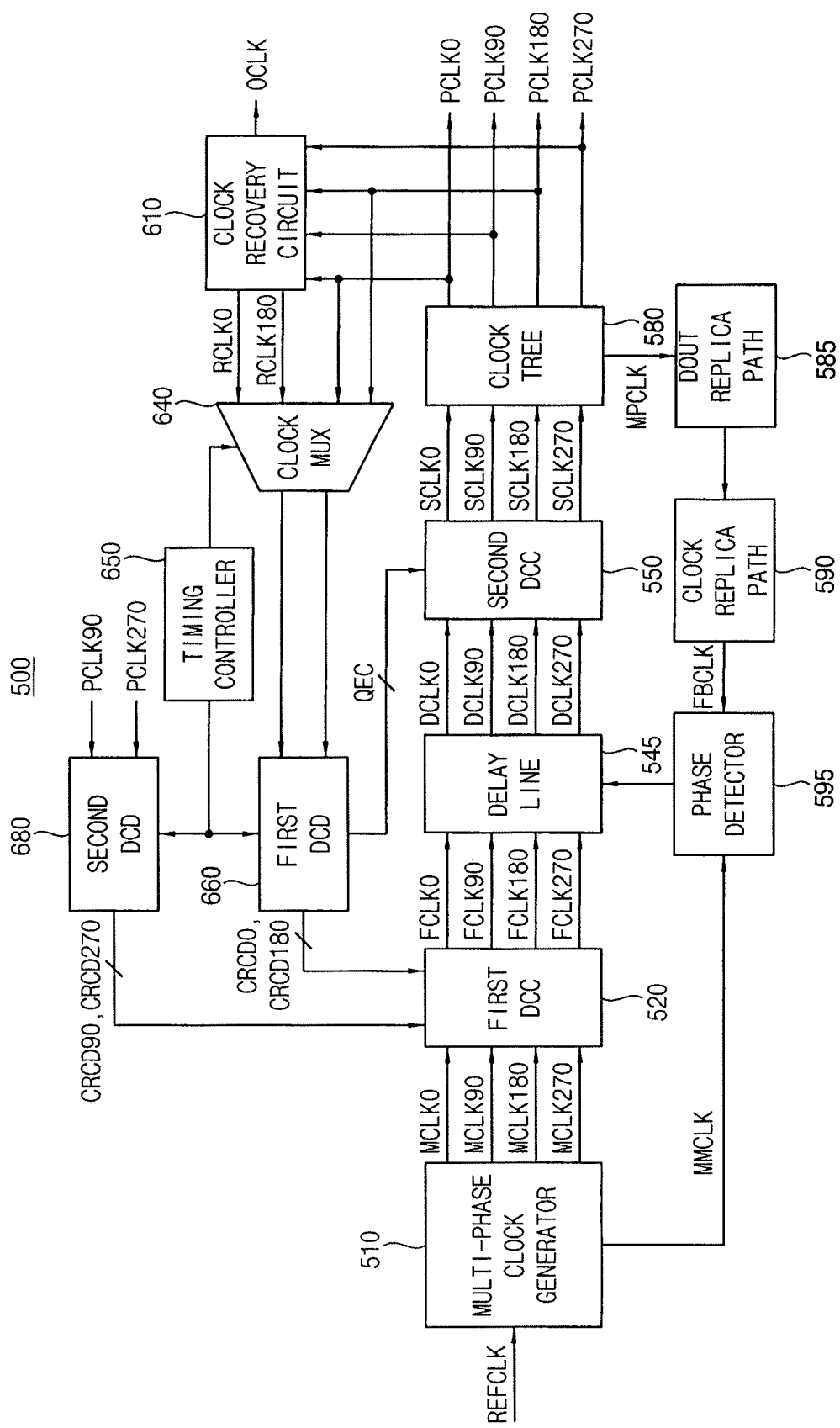
FIG. 4 illustrates a DLL circuit in the semiconductor memory device of FIG. 2 according to example embodiments.

FIG. 4 is a block diagram illustrating the DLL circuit in the semiconductor memory device of FIG. 2 according to example embodiments. Referring to FIG. 4, the DLL circuit 500 may include a multi-phase clock generator 510, a first duty cycle corrector (DCC) 520, a delay line 545, a second DCC 550, a clock tree 580, a clock recovery circuit 610, a clock multiplexer 640, a timing controller 650, a first duty cycle detector (DCD) 660, and a second DCD 680. The DLL circuit 500 may further include a data replica path 585, a clock replica path 590 and a phase detector 595.

The multi-phase clock generator 510 may receive the reference clock signal REFCLK, and may divide a frequency of the reference clock signal REFCLK to generate first through fourth divided clock signals MCLK0, MCLK90, MCLK180, and MCLK270 which have a phase difference of 90 degrees with respect to each other. A frequency of each of the first through fourth divided clock signals MCLK0, MCLK90, MCLK180 and MCLK270 may be a half of a frequency of the reference clock signal REFCLK.

The first DCC 520, in response to a first correction code, e.g., first to fourth correction sub codes, CRCD0, CRCD90, CRCD180, and CRCD270, may correct duty errors of at least some of the first through fourth divided clock signals MCLK0, MCLK90, MCLK180, and MCLK270 to provide the first through fourth corrected clock signals FCLK0, FCLK90, FCLK180, and FCLK270. For example, the first DCC 520 may compensate for duty errors using first to fourth correction sub codes.

The delay line 545 may delay at least some of the first through fourth corrected clock signals FCLK0, FCLK90, FCLK180, and FCLK270 to provide first through fourth delayed clock signals DCLK0, DCLK90, DCLK180, and DCLK270.

The second DCC 550, in response to a second correction code QEC, may adjust delays of at least some of the second through fourth delayed clock signals DCLK90, DCLK180, and DCLK270 of the first through fourth delayed clock signals DCLK0, DCLK90, DCLK180 and DCLK270 to provide first through fourth source clock signals SCLK0, SCLK90, SCLK180, and SCLK270. For example, the second DCC 550 may compensate for phase skews.

The clock tree 580 may provide the first through fourth source clock signals SCLK0, SCLK90, SCLK180, and SCLK270 to an inside of the semiconductor memory device 200 as first through fourth propagation clock signals PCLK0, PCLK90, PCLK180 and PCLK270.

The data replica path 585 may provide a delay which is substantially the same as a delay of the data I/O buffer 295. The clock replica path 590 may provide a delay which is substantially the same as a delay of the clock buffer 430. The data replica path 585 and the clock replica path 590 may delay an average propagation clock signal MPCLK provided from the clock tree 580 to provide a feedback clock signal FBCLK to the phase detector 595.

The phase detector 595 may detect a phase difference between an average divided clock signal MMCLK and the average propagation clock signal MPCLK, and may adjust an amount of delay of the delay line 545 in accordance therewith. The multi-phase clock generator 510 may provide the averaged divided clock signal MMCLK to the phase detector 595.

The clock recovery circuit 610 may receive the first through fourth propagation clock signals PCLK0, PCLK90, PCLK180, and PCLK270, may generate first and second recovered clock signal RCLK0 and RCLK180 based on the first through fourth propagation clock signals PCLK0, PCLK90, PCLK180, and PCLK270, and may output one of the first and second recovered clock signal RCLK0 and RCLK180 as the output clock signal OCLK.

The clock multiplexer 640 may receive a first pair, including the first and second recovered clock signal RCLK0 and RCLK180, and a second pair, including the first and third propagation clock signals PCLK0 and PCLK180, and may select one of the first pair and the second pair according to a control of the timing controller 650 to output the selected pair to the first DCD 660.

The first DCD 660 may detect duty errors of the first and third propagation clock signals PCLK0 and PCLK180, may generate first and third sub correction codes CRCD0 and CRCD180 based on the detected duty errors, and may detect duty errors of the first and second recovered clock signal RCLK0 and RCLK180 to generate the second correction code QEC. The first DCD 660 may provide the first and third sub correction codes CRCD0 and CRCD180 to the first DCC 520, and may provide the second correction code QEC to the second DCC 550.

The second DCD 680 may detect duty errors of the second and fourth propagation clock signals PCLK90 and PCLK270, and may generate second and fourth sub correction codes CRCD90 and CRCD270 based on the detected duty errors. The second DCD 680 may provide the second and fourth sub correction codes CRCD90 and CRCD270 to the first DCC 520.

The timing controller 650 may control operation timings of the first DCD 660, the second DCD 680, and the clock multiplexer 640.

Figure 5:
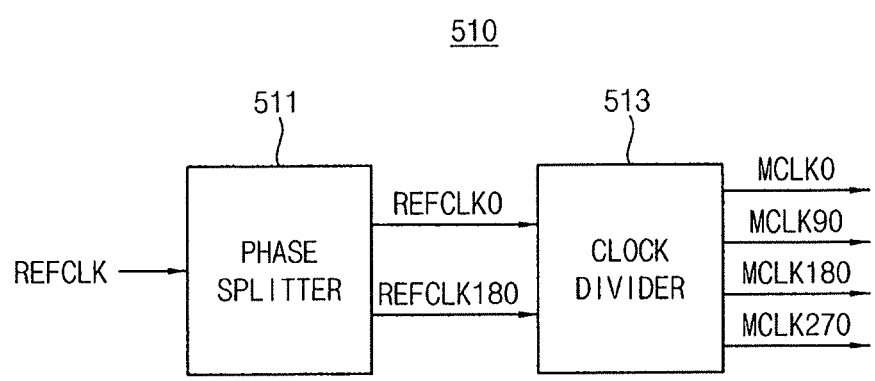
FIG. 5 illustrates an example of the multi-phase clock generator in FIG. 4 according to example embodiments.

FIG. 5 is a block diagram illustrating an example of the multi-phase clock generator 510 in FIG. 4 according to example embodiments. Referring to FIG. 5, the multi-phase clock generator 510 may include a phase splitter 511 and a clock divider 513.

The phase splitter 511 may split a phase of the reference clock signal REFCLK to output first and second reference clock signals REFCLK0 and REFCLK180 which have a phase difference of 180 degrees. The clock divider 513 may divide the first and second reference clock signals REF-CLK0 and REFCLK180 to generate the first through fourth divided clock signals MCLK0, MCLK90, MCLK180, and MCLK270.

Figure 6:
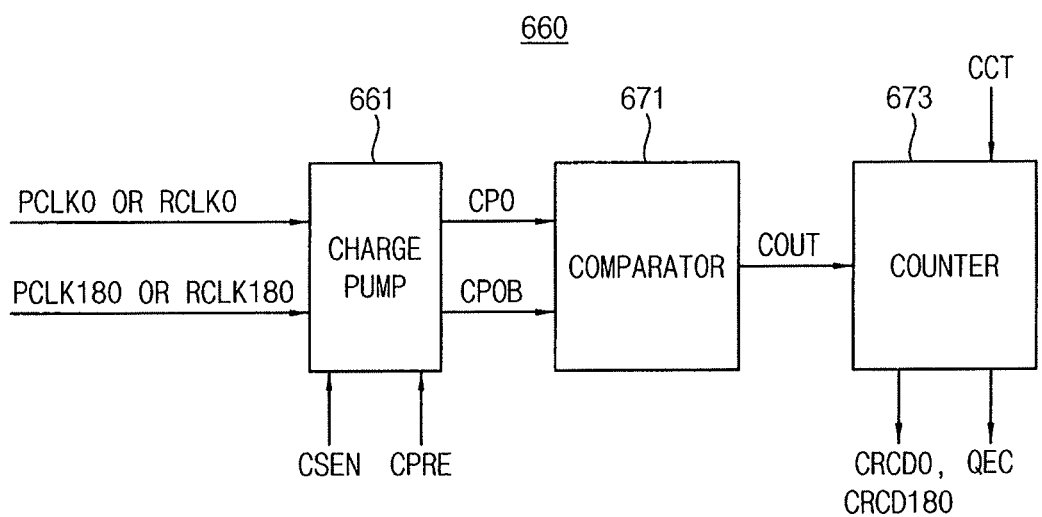
FIG. 6 illustrates an example of the first DCD in FIG. 4 according to example embodiments.

FIG. 6 is a block diagram illustrating an example of the first DCD 660 in FIG. 4 according to example embodiments. Referring to FIG. 6, the first DCD 660 may include a charge pump 661, a comparator 671, and a counter 673.

The charge pump 661 may output first and second pump voltages CPO and CPOB based on duties of the first and third propagation clock signals PCLK0 and PCLK180 or duties of the first and second recovered clock signal RCLK0 and RCLK180. The comparator 671 may compare levels of the first and second pump voltages CPO and CPOB to output a comparison signal COUT. The counter 673 may count the comparison signal COUT to output the first and third sub correction codes CRCD0 and CRCD180, and the second correction code QEC.

The charge pump 661 may operate based on a sensing control signal CSEN and a precharge control signal CPRE from the timing controller 650. The counter 673 may operate based on a control signal CCT from the timing controller 650.

Figure 7:
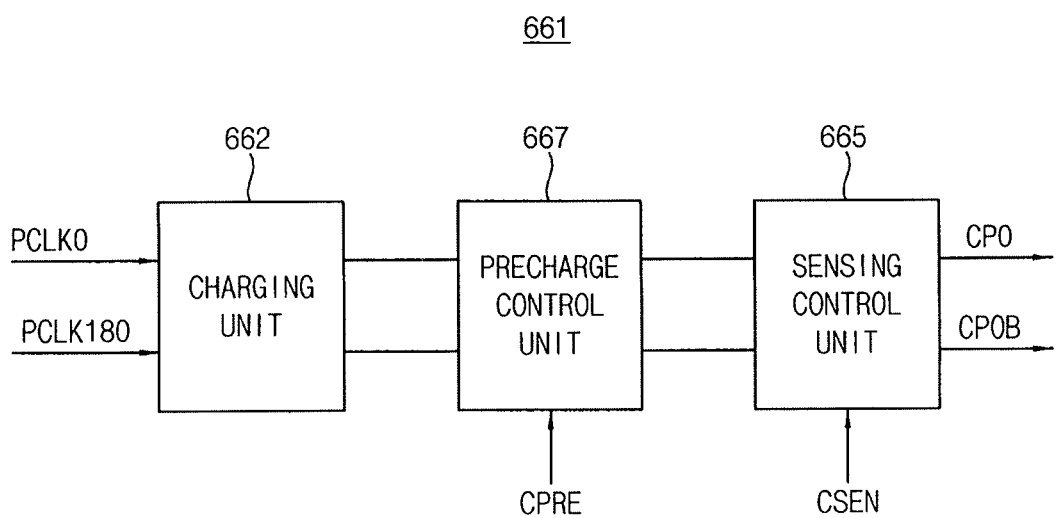
FIG. 7 illustrates a charge pump in FIG. 6.
Figure 8:
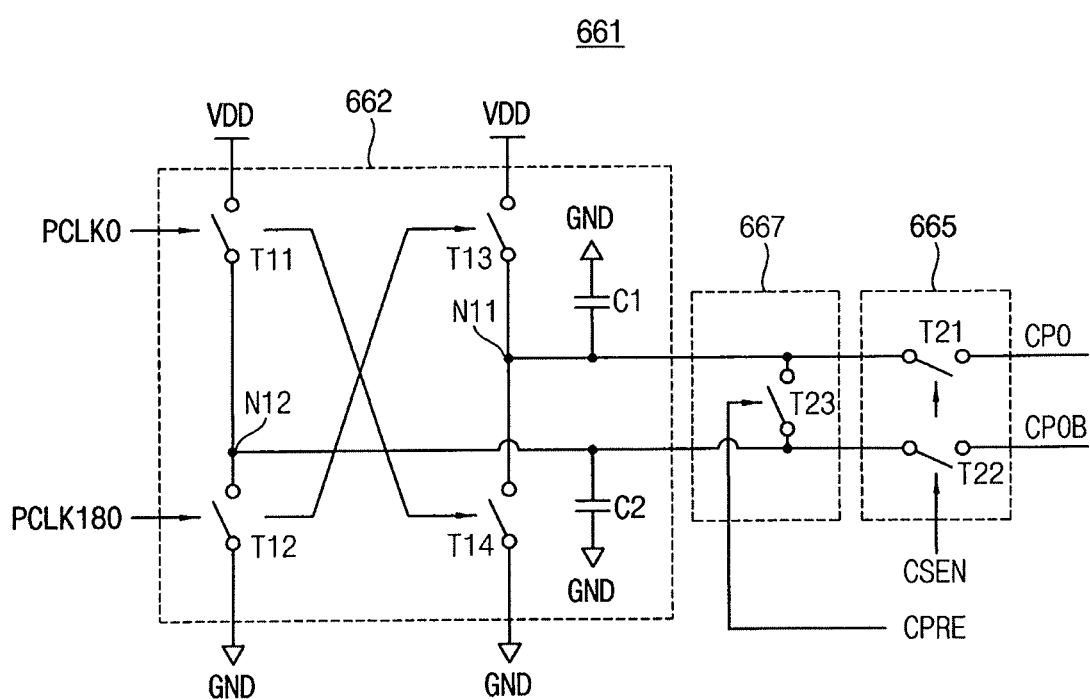
FIG. 8 illustrates a charge pump in FIG. 6 according to example embodiments.

FIG. 7 is a block diagram illustrating the charge pump 661 in FIG. 6. FIG. 8 is a circuit diagram illustrating the charge pump 661 in FIG. 6 according to example embodiments. Referring to FIGS. 7 and 8, the charge pump 661 may include a charging unit 662, a sensing control unit 665, and a precharge control unit 667.

The charging unit 662 may include a first capacitor C1 connected between a first node N11 and a ground voltage GND, a second capacitor C2 connected between a second node N12 and the ground voltage GND, and first through fourth switches T11≈T14.

The first switch T11 is connected between a power supply voltage VDD and the second node N12, and receives the first propagation clock signal PCLK0. The third switch T13 is connected between the power supply voltage VDD and the first node N11, and receives the third propagation clock signal PCLK180. The second switch T12 is connected between the second node N12 and the ground voltage GND, and receives the third propagation clock signal PCLK180. The fourth switch T14 is connected between the first node N11 and the ground voltage GND, and receives the first propagation clock signal PCLK0.

The sensing control unit 665 may include a first switch T21 and a second switch T22. The first switch T21 is connected between the first node N11 and a first input terminal of the comparator 671. The first switch T22 is connected between the second node N12 and a second input terminal of the comparator 671. The first switch T21 controls connection between the first node N11 and the first input terminal of the comparator 671 in response to the sensing control signal CSEN. The second switch T22 controls connection between the second node N12 and the first input terminal of the comparator 671 in response to the sensing control signal CSEN.

The precharge control unit 667 may include a third switch T23 connected between the first node N11 and the second node N12. The third switch T23 controls connection between the first node N11 and the second node N12.

Referring to FIGS. 6 through 8, the first and second capacitors C1 and C2 perform a charge and discharge operation based on duties of the first and third propagation clock signals PCLK0 and PCLK180. The first and second pump voltages CPO and CPOB are determined based on duties of the first and third propagation clock signals PCLK0 and PCLK180. That is, the charge pump 661 may provide the comparator 671 of the first DCD 660 with the first and second pump voltages CPO and CPOB that have levels according to the duties of the first and third propagation clock signals PCLK0 and PCLK180. Therefore, the counter 673 of the first DCD 660 may provide the first DCC 520 with the first and third sub correction codes CRCD0 and CRCD180 that represent duty characteristic of the first and third propagation clock signals PCLK0 and PCLK180.

Figure 9:
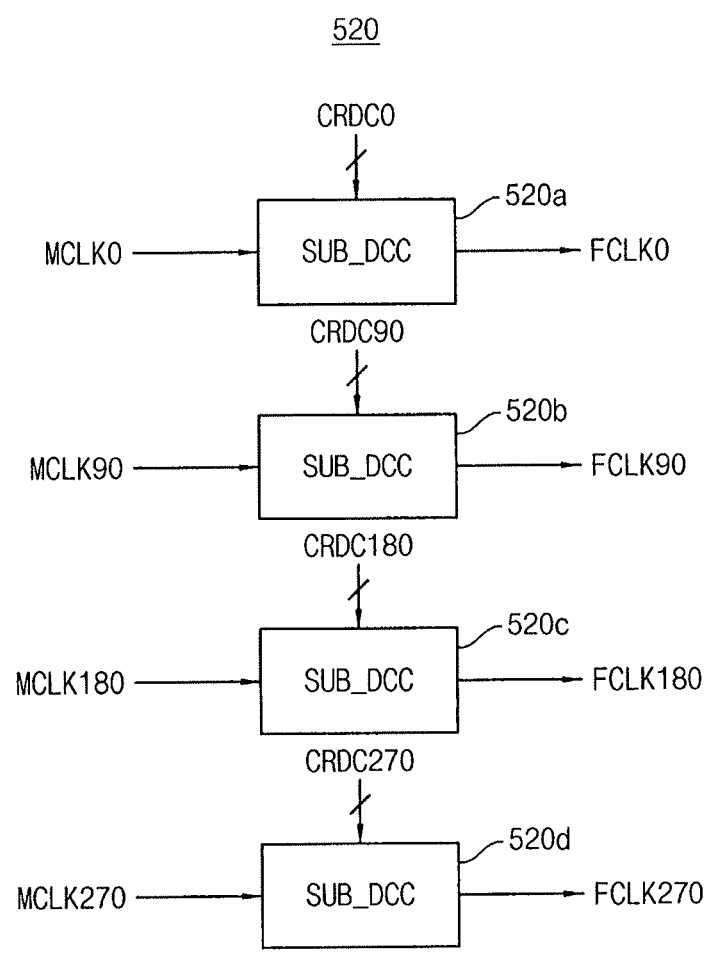
FIG. 9 illustrates an example of the first DCC in FIG. 4 according to example embodiments.

FIG. 9 is a block diagram illustrating an example of the first DCC 520 in FIG. 4 according to example embodiments. Referring to FIG. 9, the first DCC 520 may include first through fourth sub correctors 520a, 520b, 520c and 520d.

The first sub corrector 520a may correct a duty error (may adjust a duty) of the first divided clock signal MCLK0 based on the first sub correction code CRCD0 to output the first corrected clock signal FCLK0. The second sub corrector 520b may correct a duty error of the second divided clock signal MCLK90 based on the second sub correction code CRCD90 to output the second corrected clock signal FCLK90. The third sub corrector 520c may correct a duty error of the third divided clock signal MCLK180 based on the third sub correction code CRCD180 to output the third corrected clock signal FCLK180. The fourth sub corrector 520d may correct a duty error of the fourth divided clock signal MCLK270 based on the third sub correction code CRCD270 to output the fourth corrected clock signal FCLK270.

Figure 10:
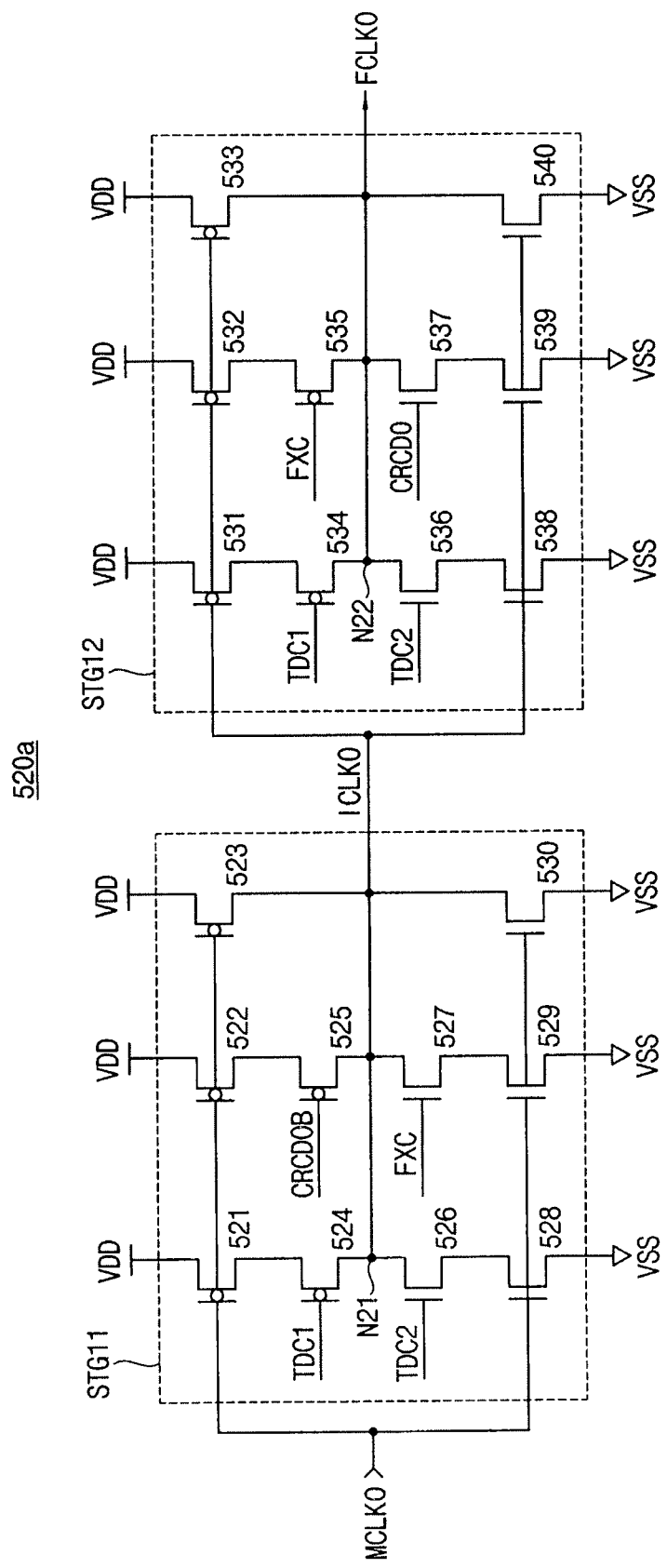
FIG. 10 illustrates an example of a configuration of the first sub corrector in the first DCC of FIG. 9 according to example embodiments.

FIG. 10 illustrates an example of a configuration of the first sub corrector 520a in the first DCC 520 of FIG. 9 according to example embodiments. A configuration of each of the second through fourth sub correctors 520b, 520c, and 520d is substantially the same as a configuration of the first sub corrector 520a. Referring to FIG. 10, the first sub corrector 520a may include a first stage STG11 and a second stage STG12. The first stage STG11 may provide a first intermediate clock signal ICLKO to the second stage STG12.

The first stage STG11 may include p-channel metal oxide semiconductor (PMOS) transistors 521, 522, and 523 connected to the power supply voltage VDD in parallel, PMOS transistors 524 and 525 connected between the PMOS transistors 521 and 522 and a first node N21, n-channel metal oxide semiconductor (NMOS) transistors 526 and 527 connected to the first node N21 in parallel, and NMOS transistors 528, 529 and 530 connected to a supply voltage VSS, e.g., a ground voltage, in parallel. The NMOS transistors 528 and 529 are connected between the NMOS transistors 526 and 527, and the supply voltage VSS, and the NMOS transistor 530 is connected between the first node N21 and the supply voltage VSS.

The first divided clock signal MCLK0 is applied to each gate of the PMOS transistors 521, 522, and 523, and to each gate of the NMOS transistors 528, 529 and 530. A first resolution code TDC1 is applied to a gate of the PMOS transistor 524 and a second resolution code TDC2 is applied to a gate of the NMOS transistor 526. A first inverted sub correction code CRCD0B is applied to a gate of the PMOS transistor 525 and a fixed code FXC is applied to a gate of the NMOS transistor 527. The first inverted sub correction code CRCD0B may be generated by inverting the first correction sub code CRCD0 output from the first DCD. The first resolution code TDC1, the second resolution code TDC2, and the fixed code FXC may be included in the second control signal CTL2 in FIG. 2. Alternatively, the control logic circuit 210 may provide the first resolution code TDC1, the second resolution code TDC2, and/or the fixed code FXC separately from the second control signal CTL2.

The first resolution code TDC1 and the second resolution code TDC2 have a different logic level. The second resolution code TDC2 may have a low level in a coarse lock mode and a high level in a fine lock mode. The fixed code FXC may have a low level. Therefore, when the first divided clock signal MCLK0 has a low level, the first stage STG11 may provide a first intermediate clock signal ICLKO by adjusting an amount of current that flows from the first node N21 to the second stage STG12 and adjusting a slope of an edge, e.g., a falling edge, of the first divided clock signal MCLK0.

The second stage STG12 may include PMOS transistors 531, 532 and 533 connected to the power supply voltage VDD in parallel, PMOS transistors 534 and 535 connected between the PMOS transistors 531 and 532 and a second node N22, NMOS transistors 536 and 537 connected to the second node N22 in parallel, and NMOS transistors 538, 539, and 540 connected to the supply voltage VSS in parallel. The NMOS transistors 538 and 539 are connected between the NMOS transistors 536 and 537 and the supply voltage VSS, and the NMOS transistor 540 is connected between the second node N22 and the supply voltage VSS.

The first intermediate clock signal ICLKO is applied to each gate of the PMOS transistors 531, 532, and 533 and to each gate of the NMOS transistors 538, 539, and 540, the first resolution code TDC1 is applied to a gate of the PMOS transistor 534, the second resolution code TDC2 is applied to a gate of the NMOS transistor 536, the fixed code FXC is applied to a gate of the PMOS transistor 535, and the first sub correction code CRCD0 is applied to a gate of the NMOS transistor 537. Therefore, when the first intermediate clock signal ICLKO has a high level, the second stage STG12 may provide the first corrected clock signal FCLK0 by adjusting an amount of current that flows from the second node N22 to the second stage STG12 and adjusting a slope of an edge, e.g., a falling edge, of the first intermediate clock signal ICLKO.

Figure 11:
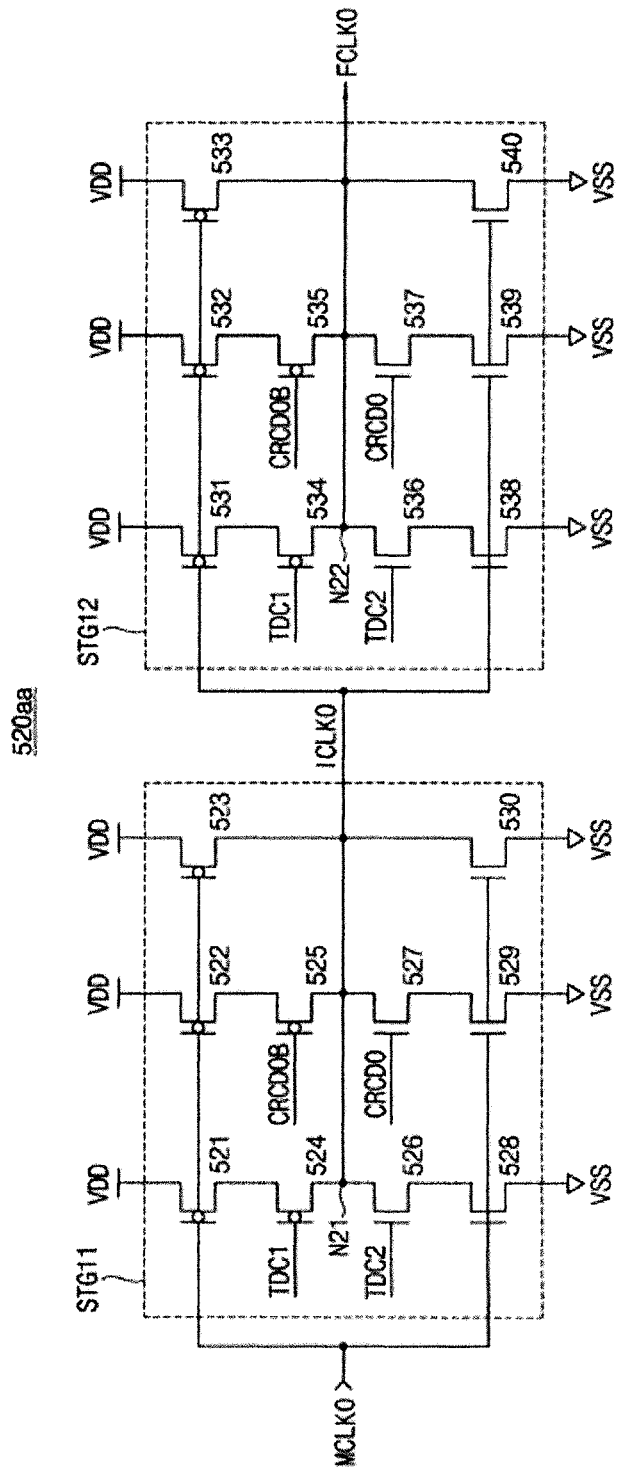
FIG. 11 illustrates another example of a configuration of the first sub corrector in the first DCC of FIG. 9 according to example embodiments.

FIG. 11 illustrates another example of a configuration of the first sub corrector in the first DCC of FIG. 9 according to example embodiments. A first sub corrector 520aa in FIG. 11 differs from the first sub corrector 520a in that the first sub correction code CRCD0, instead of the fixed code FXC, is applied to the gate of the NMOS transistor 527, and the first inverted sub correction code, instead of the fixed code FXC, is applied to the gate of the PMOS transistor 535. Therefore, the first sub corrector 520aa may adjust a rising edge and a falling edge of the first divided clock signal MCLK0 in response to the first sub correction code CRCD0 and the first inverted sub correction code CRCD0B to provide the first corrected clock signal FCLK0.

The first DCC 520 of FIG. 9 may adjust a slope of an edge of the first divided clock signal MCLK0 in response to the first sub correction code CRCD0 to provide the first corrected clock signal FCLK0 and may adjust a slope of an edge of the second divided clock signal MCLK90 in response to the second sub correction code CRCD90 to provide the second corrected clock signal FCLK90.

Figure 12:
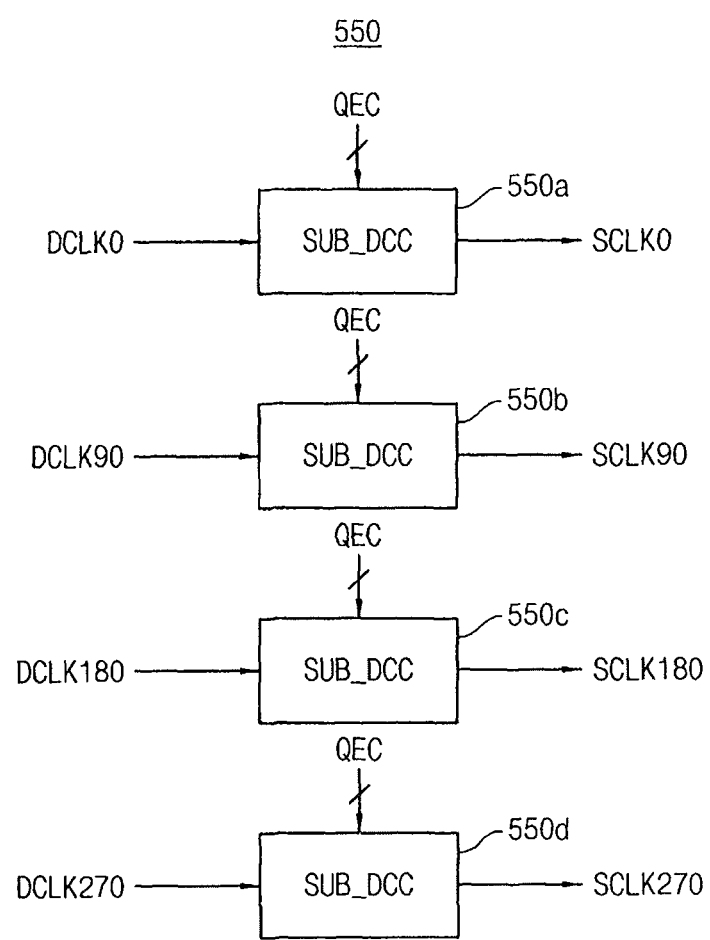
FIG. 12 illustrates a block diagram illustrating an example of the second DCC in FIG. 4 according to example embodiments.

FIG. 12 is a block diagram illustrating an example of the second DCC 550 in FIG. 4 according to example embodiments. Referring to FIG. 12, the second DCC 550 may include first through fourth sub correctors 550a, 550b, 550c and 550d.

The first sub corrector 550a may maintain and/or adjust a delay of the first delayed clock signal DCLK0 based on the second correction code QEC to output the first source clock signal SCLK0. The second sub corrector 550b may adjust a delay of the second delayed clock signal DCLK90 based on the second correction code QEC to output the second source clock signal SCLK90. The third sub corrector 550c may adjust a delay of the third delayed clock signal DCLK180 based on the second correction code QEC to output the third source clock signal SCLK180. The fourth sub corrector 550d may adjust a delay of the fourth delayed clock signal DCLK270 based on the second correction code QEC to output the fourth source clock signal SCLK270.

That is, the second DCC 550 may adjust delays at least some of the second through fourth delayed clock signal DCLK90, DCLK180, and DCLK270 to provide the first through fourth source clock signal SCLK0, SCLK90, SCLK180, and SCLK270.

Figure 13:
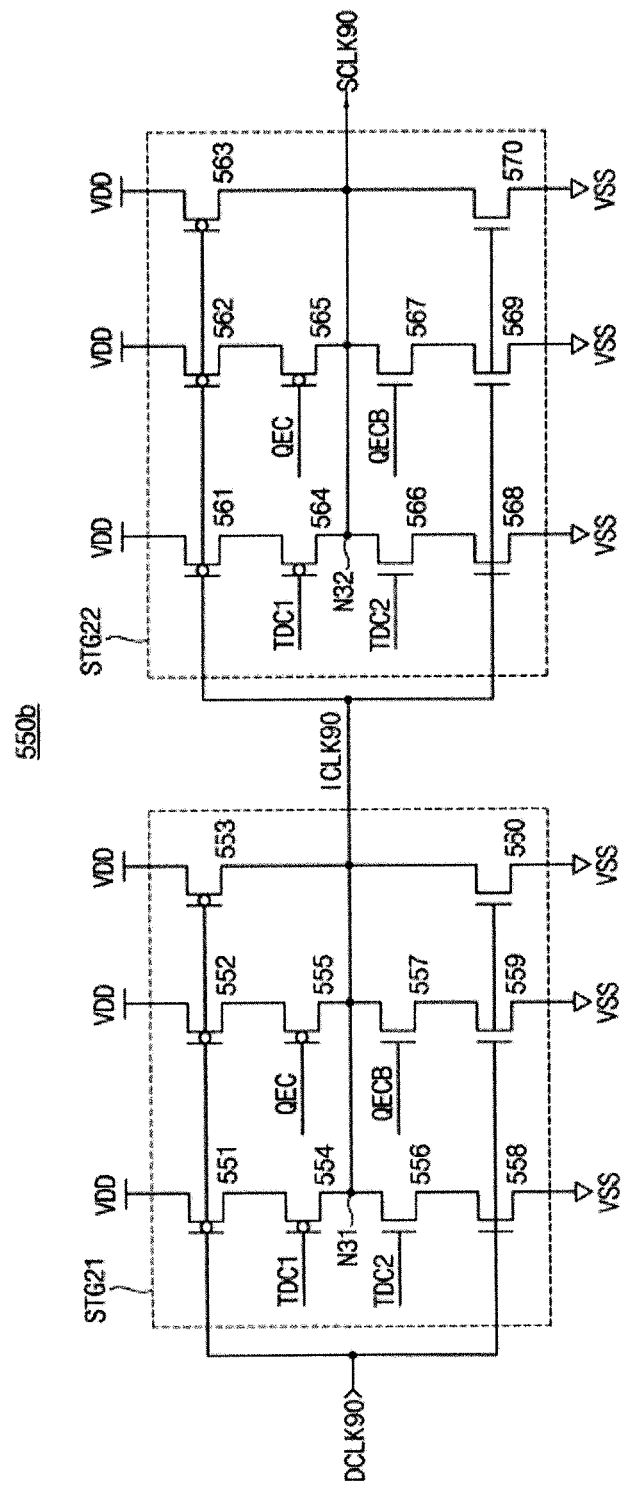
FIG. 13 illustrates an example of a configuration of the second sub corrector in the second DCC of FIG. 12 according to example embodiments.

FIG. 13 illustrates an example of a configuration of the second sub corrector 550b in the second DCC 550 of FIG. 12 according to example embodiments. A configuration of each of the first, third, and fourth sub correctors 550a, 550c, and 550d is substantially the same as a configuration of the second sub corrector 550b.

Referring to FIG. 13, the second sub corrector 550b may include a first stage
STG21 and a second stage STG22. The first stage STG21 may provide a second intermediate clock signal ICLK90 to the second stage STG22.

The first stage STG21 may include PMOS transistors 551~555 and NMOS transistors 556~560. The second stage STG21 may include PMOS transistors 561~565 and NMOS transistors 566~570. The first stage STG21 receives the second delayed clock signal DCLK90, and provides the second intermediate clock signal ICLK90 at a first node N31. The second stage STG22 receives the second intermediate clock signal ICLK90, and outputs the second source clock signal SCLK90 at a second node N32.

Each configuration of the first stage STG21 and the second stage STG22 may be substantially the same as each configuration of the first stage STG11 and the second stage STG12 in FIG. 10. The second sub corrector 550b differs from the first sub corrector 520a of FIG. 10 in that the second correction code QEC is applied to a gate of the PMOS transistor 555 and the PMOS transistor 565, and a second inverted second correction code QECB is applied to a gate of the NMOS transistor 557 and the NMOS transistor 567. The second inverted second correction code QECB may be generated by inverting the second correction code QEC.

Therefore, when the second delayed clock signal DCLK90 has a high level, the second sub corrector 550b may adjust an amount of current that flows from the first node N31 to the supply voltage VSS and may adjust an amount of current that flows from the power supply voltage VDD to the second node N32. In addition, when the second delayed clock signal DCLK90 has a low level, the second sub corrector 550b may adjust an amount of current that flows from the first node N31 to the second stage STG32 and may adjust an amount of current that flows from the second node N32 to the supply voltage VSS. Therefore, the second sub corrector 550b may adjust a delay of the second delayed clock signal DCLK90 to provide the second source clock signal SCLK90.

Figure 14:
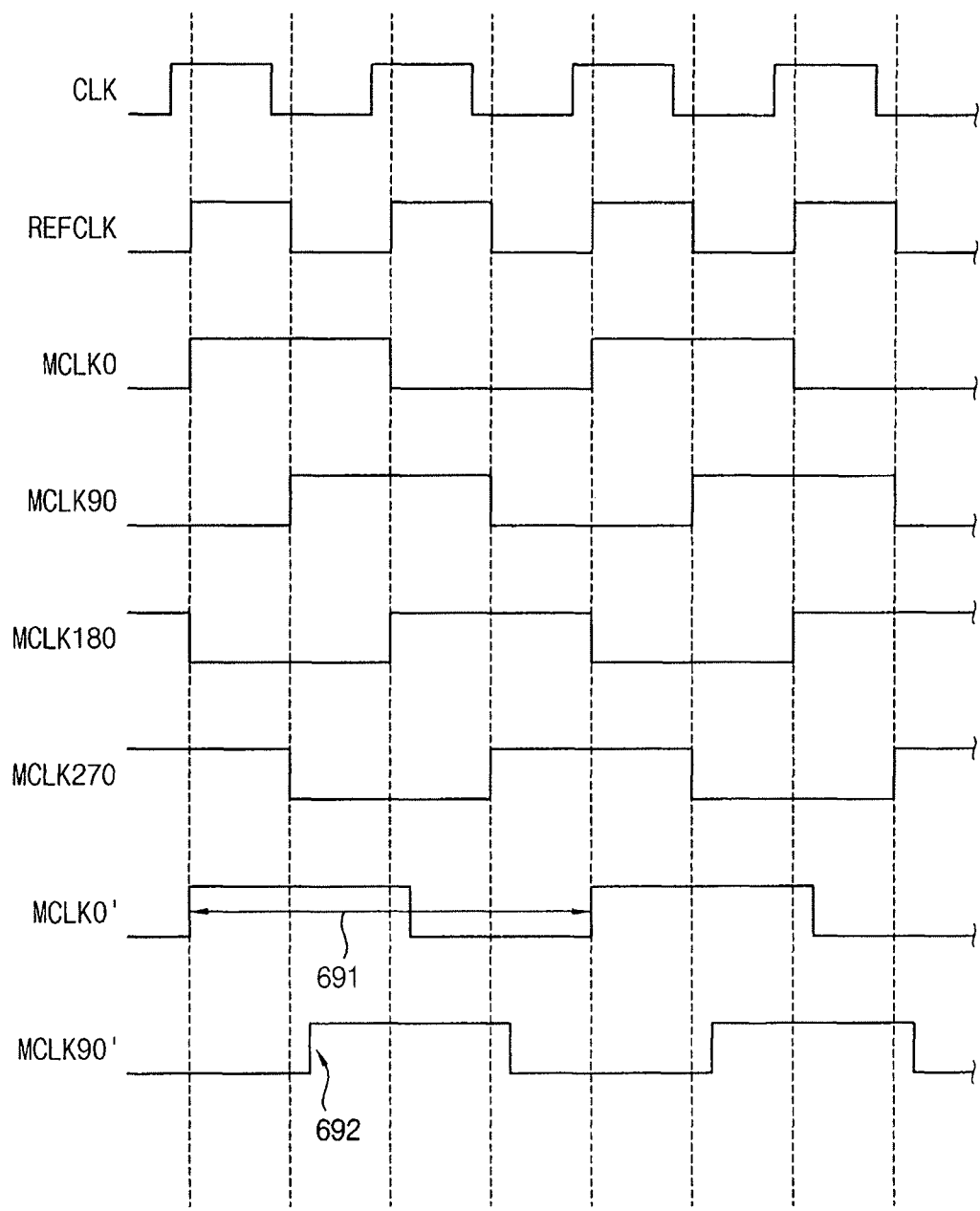
FIG. 14 illustrates various clock signals in the DLL circuit of FIG. 4.

FIG. 14 illustrates various clock signals in the DLL circuit of FIG. 4. In FIG. 14, the clock signal CLK is also illustrated for convenience of explanation.

Referring to FIGS. 2, 4, 5, and 14, the clock buffer 430 delays the clock signal CLK to provide the reference clock signal REFCLK. The multi-phase clock generator 510 divides the reference clock signal REFCLK to generate the first through fourth divided clock signals MCLK0, MCLK90, MCLK180, and MCLK270 which have a phase difference of 90 degrees with respect to each other.

Errors may occur in the first through fourth divided clock signals MCLK0, MCLK90, MCLK180, and MCLK270. For example, a duty error is illustrated by the divided clock signal MCLK0', indicated by reference numeral 691, or a phase skew is illustrated in the divided clock signal MCLK90', indicated by reference numeral 692. Duty errors or phase skews may occur in the first through fourth divided clock signals MCLK0, MCLK90, MCLK180, and MCLK270, and the first and second recovered clock signal RCLK0 and RCLK180 may also have duty error. Example embodiments may correct duty errors and phase skews in the divided clock signals through two duty cycle corrections.

Figure 15:
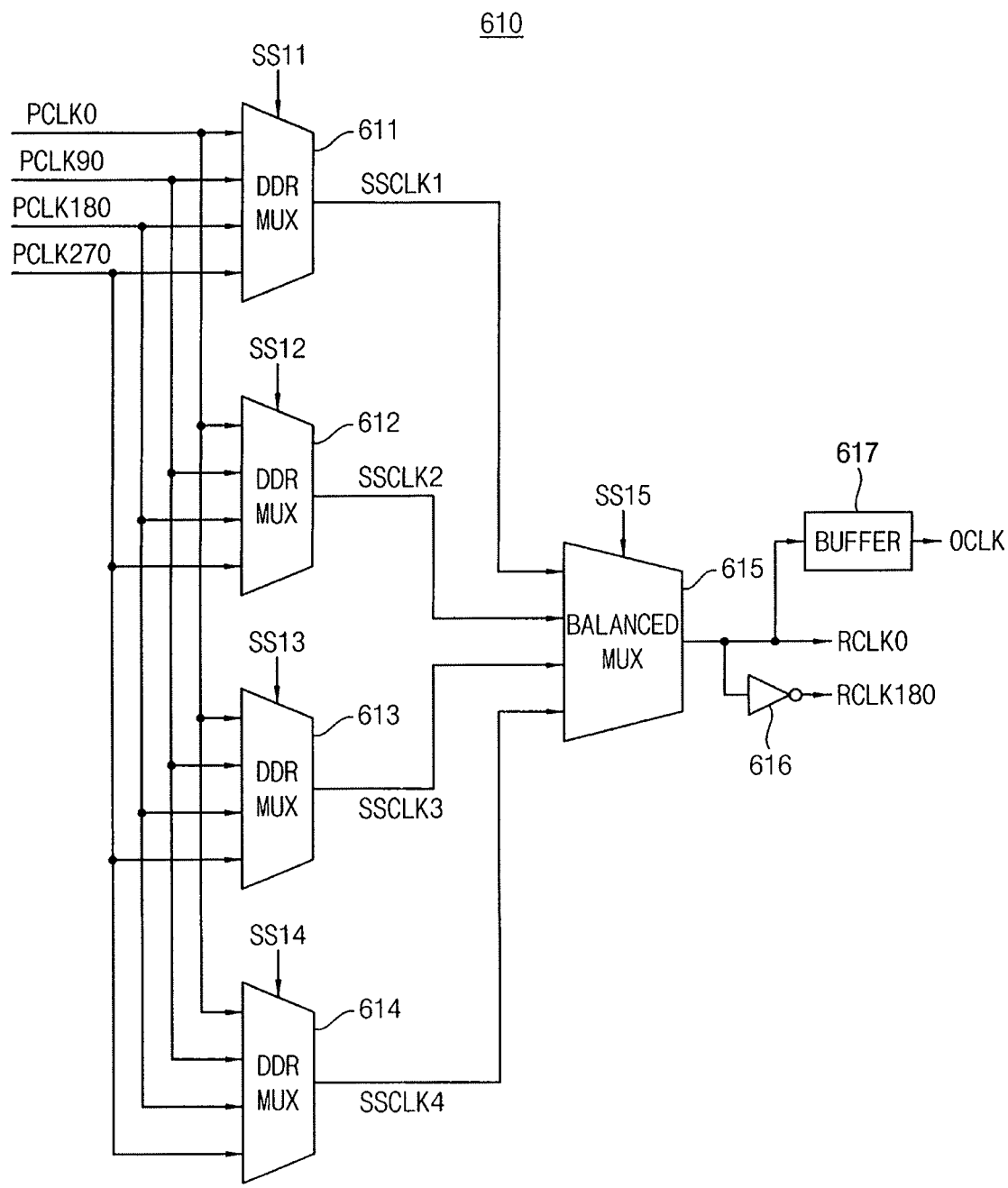
FIG. 15 illustrates an example of the clock recovery circuit in FIG. 4 according to example embodiments.
Figure 16:
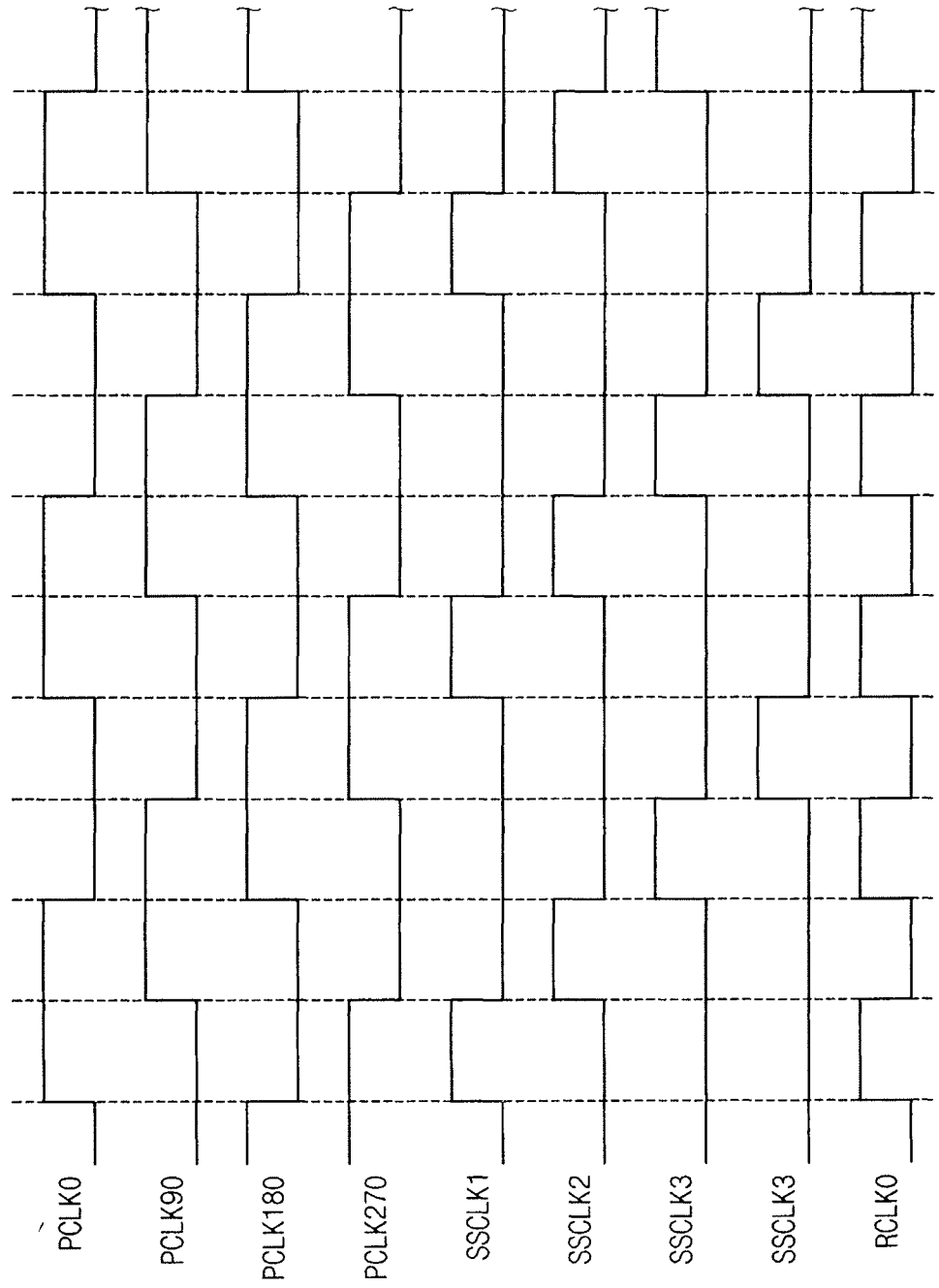
FIG. 16 illustrates an operation of the clock recovery circuit of FIG. 15.

FIG. 15 is a block diagram illustrating an example of the clock recovery circuit 610 in FIG. 4 according to example embodiments. FIG. 16 illustrates an operation of the clock recovery circuit of FIG. 15. Referring to FIGS. 15 and 16, the clock recovery circuit 610 may include multiplexers 611~615, an inverter 616 and a buffer 617.

Each of the multiplexers 611~614 may be a double data rate (DDR) multiplexer and the multiplexer 615 may be a balanced multiplexer, e.g., delay paths therethrough are equal. Each of the multiplexers 611~614, in response to selection signals SS11~SS14, may output first through fourth selected clock signals SSCLK1~SSCLK4, respectively, each of which is enabled during a quarter period of each of the first through fourth propagation clock signal PCLK0, PCLK90, PCLK180, and PCLK270.

The multiplexer 615 receives the first through fourth selected clock signals SSCLK1~SSCLK4, and alternately selects the first selected clock signal SSCLK1 and the third selected clock signal SSCLK3, in response to a selection signal SS15, to output the first recovered clock signal RCLK0. The inverter 616 inverts the first recovered clock signal RCLK0 to output the second recovered clock signal RCLK180. The buffer 617 buffers the first recovered clock signal RCLK0 to output the output clock signal OCLK. The selection signals SS11~SS15 may be included in the second control signal CTL2 in FIG. 2. Alternatively, the multiplexer 615 receives the first through fourth selected clock signals SSCLK1~SSCLK4, and alternately selects the second selected clock signal SSCLK2 and the fourth selected clock signal SSCLK4, in response to the selection signal SS15, to output the second recovered clock signal RCLK180 (not illustrated). In this case, the buffer 617 may buffer the second recovered clock signal RCLK180 to output the output clock signal OCLK (not illustrated).

Figure 17:
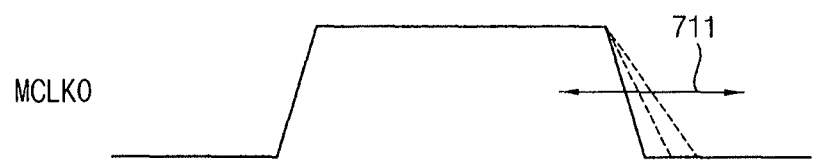
FIG. 17 illustrates an operation of the first sub corrector of FIG. 10.

FIG. 17 illustrates an operation of the first sub corrector 520a of FIG. 10. Referring to FIGS. 10 and 17, the first sub corrector 520a may adjust a slope of a falling edge of the first divided clock signal MCLK0 in response to the first sub correction code CRCD0 to output the first corrected clock signal FCLK0 as indicated by reference numeral 711. For example, the slope of the falling edge may be lessened. Thus, a duty cycle error may be compensated.

Figure 18:
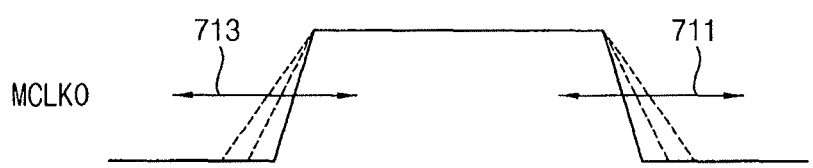
FIG. 18 illustrates an operation of the first sub corrector of FIG. 11.

FIG. 18 illustrates an operation of the first sub corrector 520aa of FIG. 11. Referring to FIGS. 11 and 18, the first sub corrector 520aa may adjust a slope of a falling edge of the first divided clock signal MCLK0 indicated by reference numeral 711 and may adjust a slope of a rising edge of the first divided clock signal MCLK0 indicated by 713, to output the first corrected clock signal FCLK0. For example, slopes of both the falling edge and the rising edge may be lessened. Thus, a duty cycle error may be compensated.

Figure 19:
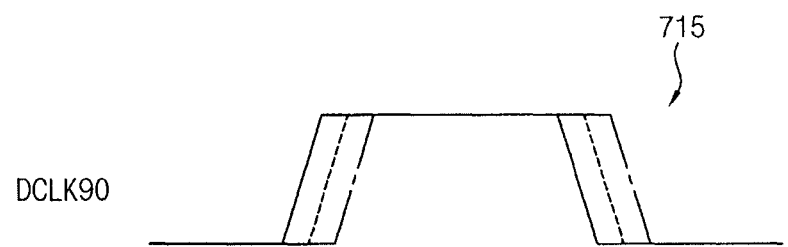
FIG. 19 illustrates an operation of the second sub corrector of FIG. 13.

FIG. 19 illustrates an operation of the second sub corrector 550b of FIG. 13. Referring to FIGS. 13 and 19, the second sub corrector 550b may adjust a delay of the second delay signal DCLK90 indicated by 715, in response to the second correction code QEC to output the second source clock signal SCLK90. For example, start times of a rising edge and a falling edge may be delayed by a same amount, e.g., the second delay signal DCLK90 may be shifted. Thus, a phase shift error may be compensated.

Figure 20:
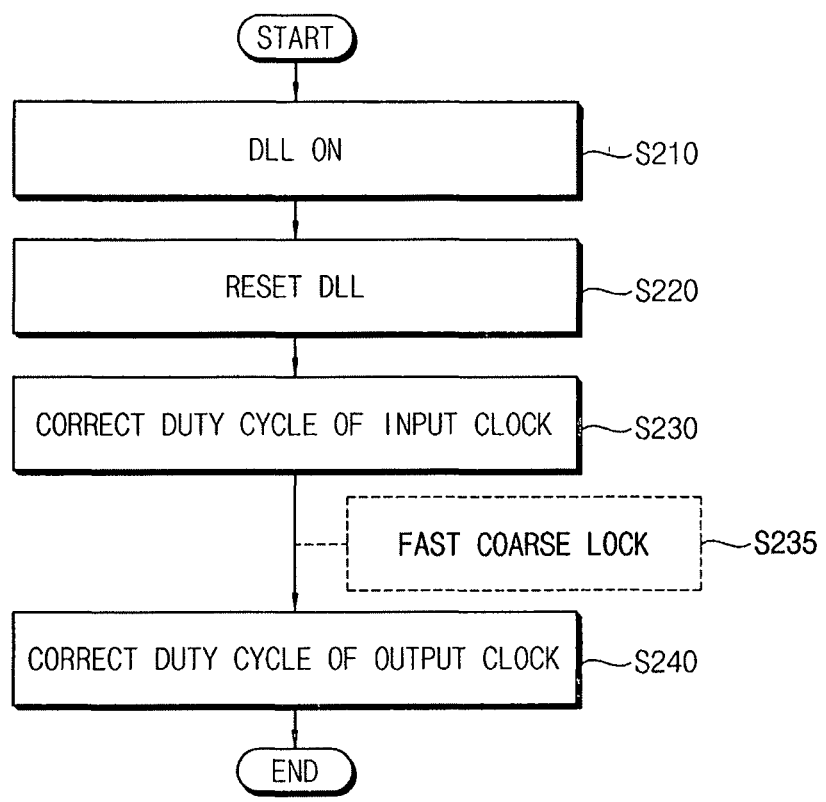
FIG. 20 illustrates a flow chart of an operation of the DLL circuit of FIG. 4 according to example embodiments.

FIG. 20 is a flow chart illustrating an operation of the DLL circuit 500 of FIG. 4 according to example embodiments. Referring to FIGS. 4 through 20, the DLL circuit 500 is activated (S210). The DLL circuit 500 is reset (S220). The DLL circuit 500 resets the first correction codes CRCD and the second correction code QEC. The first DCC 520 corrects duty errors of the divided clock signals (input clock signals) MCLK0, MCLK90, MCLK180, and MCLK270 in response to the first correction codes CRCD generated based on duty errors of the first through fourth propagation clock signals PCLK0, PCLK90, PCLK180, and PCLK270 (S230). The second DCC 550 corrects duty errors of the delayed clock signals (output clock signals) DCLK0, DCLK90, DCLK180, and DCLK270 based on the second correction code QEC generated based on duty errors of the recovered clock signal RCLK0 and RCLK180. Fast coarse lock may be performed (S235) between the operations (S230 and S240), e.g., the second resolution code TDC2 having a low level may be supplied to the first DCC 520 of the DLL circuit 500, and then the second resolution code TDC2 having a high level may be supplied to the first DCC 520 of the DLL circuit 500.

Figure 21:
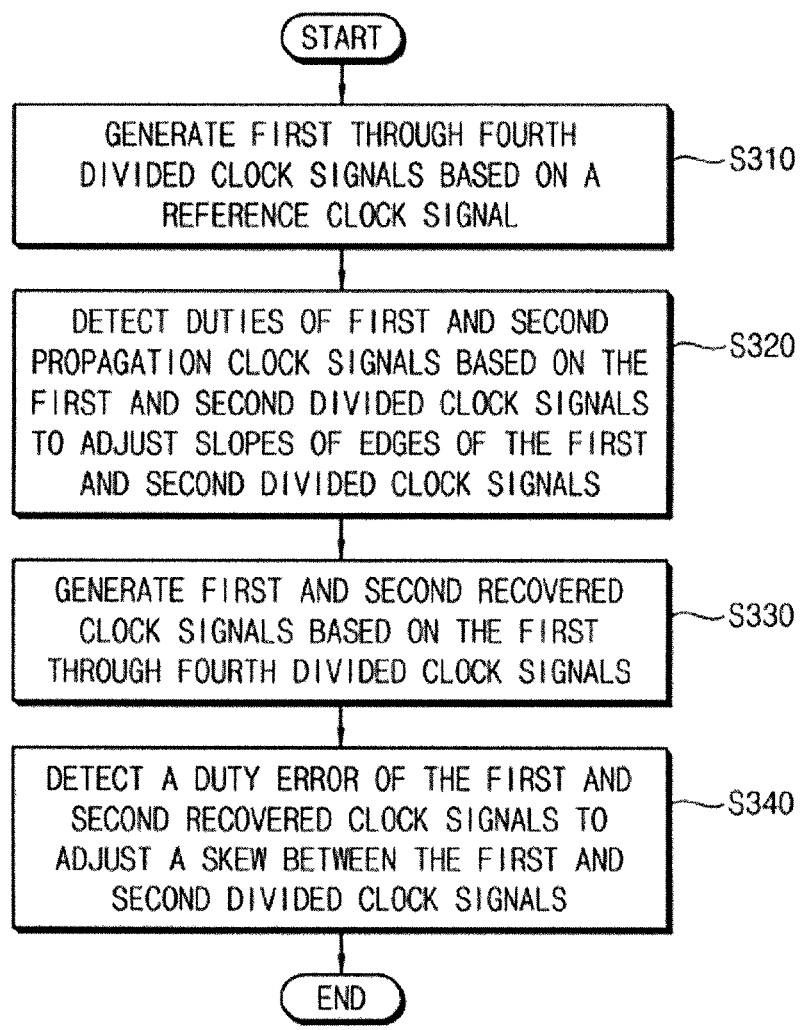
FIG. 21 illustrates a flow chart of an operation of the DLL circuit of FIG. 4 according to example embodiments.

FIG. 21 is a flow chart illustrating an operation of the DLL circuit 500 of FIG. 4 according to example embodiments. Referring to FIGS. 4 through 19 and 21, in a method of operating a DLL circuit 500, first through fourth divided clock signals MCLK0, MCLK90, MCLK180, and MCLK270 which have a phase difference of 90 degrees with respect to each other are generated based on a reference clock signal REFCLK (S310).

Slopes of edges, e.g., falling and/or rising edges, of the first and second divided clock signals MCLK0 and MCLK90 are adjusted by detecting duties of first and second propagation clock signals PCLK0 and PCLK90 (S320).

Recovered clock signals RCLK0 and RCLK180 are generated based on the first through fourth divided clock signals MCLK0, MCLK90, MCLK180, and MCLK270 (S330). A delay of a second delayed signal DCLK90, generated by delaying the second divided clock signal MCLK90, is adjusted by detecting duties of the recovered clock signals RCLK0 and RCLK180 (S340).

According to example embodiments, duties of the first and second propagation clock signals PCLK0 and PCLK90 are detected, slopes of edges of the first and second divided clock signals MCLK0 and MCLK90 are adjusted based on the detected duties of the first and second propagation clock signals PCLK0 and PCLK90, and a skew between the first and third divided clock signals MCLK0 and MCLK180 is compensated for. Duty of the recovered clock signal RCLK0 is detected, a delay of the second delayed clock signal DCLK90 is adjusted based on the detected duty of the recovered clock signal RCLK0, and a skew between the first and second divided clock signals MCLK0 and MCLK90 is compensated.

Figure 22:
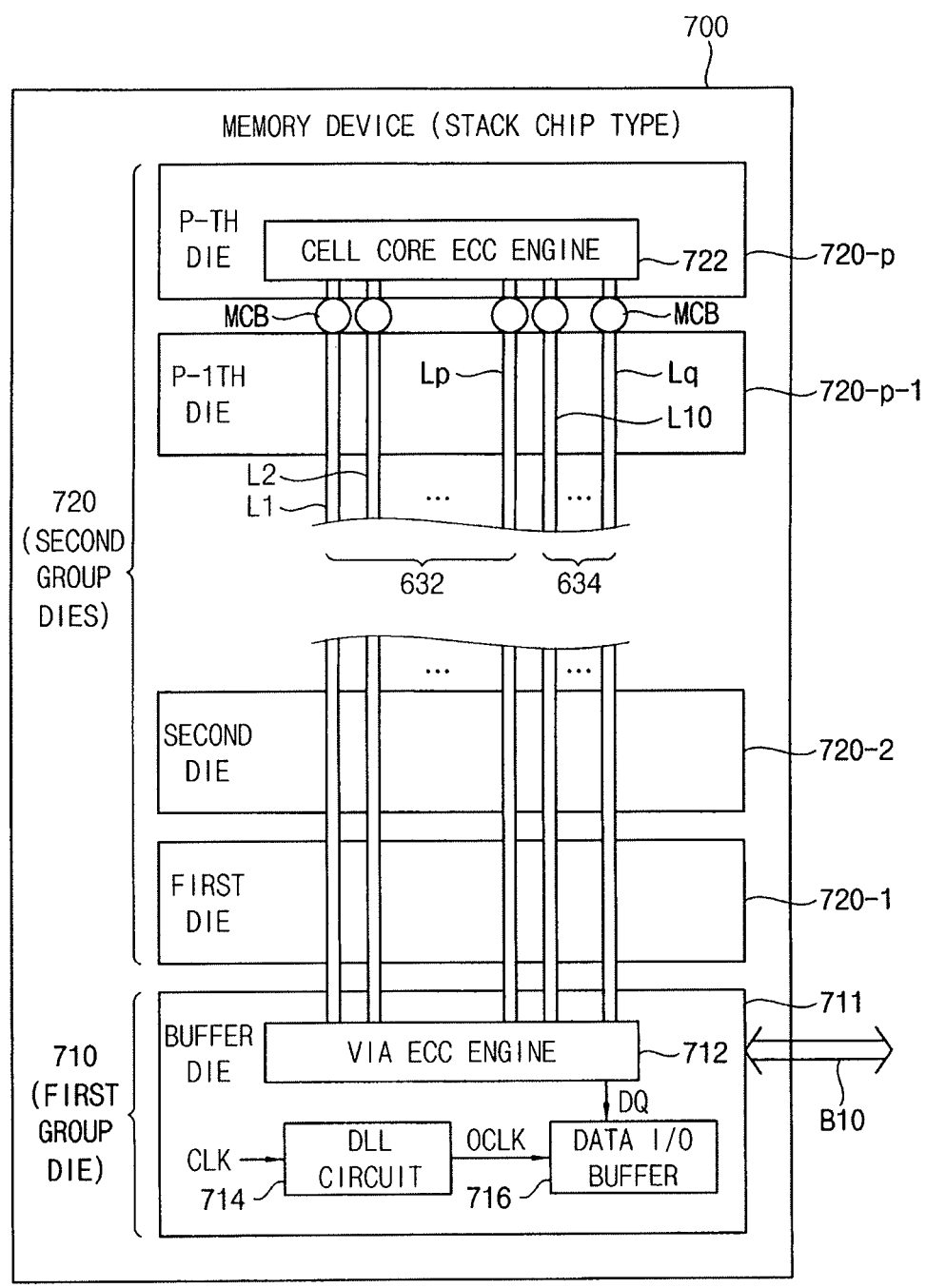
FIG. 22 illustrates a block diagram of a semiconductor memory device according to example embodiments.

FIG. 22 illustrates a semiconductor memory device according to example embodiments. Referring to FIG. 22, a semiconductor memory device 700 may include first group die 710 and second group dies 720 providing a soft error analyzing and correcting function in a stacked chip structure.

The first group die 710 may include at least one buffer die 711. The second group dies 720 may include a plurality of memory dies 720-1 to 720-p which is stacked on the first group die 710 and conveys data through a plurality of through silicon via (TSV) lines.

At least one of the memory dies 720-1 to 720-p may include a first type ECC engine (i.e., a first type ECC engine) 722 which generates transmission parity bits (i.e., transmission parity data) based on transmission data to be sent to the first group die 710. The first type ECC engine 722 may be referred to as 'cell core ECC engine'.

The buffer die 711 may include a second type ECC engine (i.e., a second type ECC engine) 712 which corrects a transmission error using the transmission parity bits when a transmission error is detected from the transmission data received through the through silicon via (TSV) lines and generates error-corrected data. The second type ECC engine 712 may be referred to as 'via ECC engine'. The buffer die 711 may further include a DLL circuit 714 and a data I/O buffer 716. The DLL circuit 714 may employ the DLL circuit 500 of FIG. 4. The DLL circuit 714 receives a clock signal CLK and provides the data I/O buffer 716 with an output clock signal OCLK which is synchronized with the clock signal CLK. The data I/O buffer 716 may output data DQ from the second type ECC engine 712.

The semiconductor memory device 700 may be a stack chip type memory device or a stacked memory device which conveys data and control signals through the TSV lines. The TSV lines may be also called 'through electrodes'.

The first type ECC engine 722 may perform error correction on data which is outputted from the memory die 720-p before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

For example, when the transmission data is 128-bit data, the transmission parity bits may be set to 8 bits. However, the number of transmission parity bits increases or decreases.

With the above description, a data TSV line group 632 at one memory die 720-p may include 128 TSV lines L1 to Lp, and a parity TSV line group 634 may include 8 TSV lines L10 to Lq. The TSV lines L1 to Lp of the data TSV line group 632 and the parity TSV lines L10 to Lq of the parity TSV line group 634 may be connected to micro bumps MCB correspondingly formed among the memory dies 720-1 to 720-p. At least one of the memory dies 720-1 to 720-p may include DRAM cells each including at least one access transistor and one storage capacitor.

The semiconductor memory device 700 may have a three-dimensional (3D) chip structure or a 2.5D chip structure to communicate with the host through a data bus B10. The buffer die 711 may be connected with the memory controller through the data bus B10.

The first type ECC engine 722, denoted as the cell core ECC engine, may output transmission parity bits as well as the transmission data through the parity TSV line group 634 and the data TSV line group 632 respectively. The outputted transmission data may be data which is error-corrected by the first type ECC engine 722.

The second type ECC engine 712, denoted as the via ECC engine, may determine whether a transmission error occurs at the transmission data received through the data TSV line group 632, based on the transmission parity bits received through the parity TSV line group 634. When a transmission error is detected, the second type ECC engine 712 may correct the transmission error on the transmission data using the transmission parity bits. When the transmission error is uncorrectable, the second type ECC engine 712 may output information indicating occurrence of an uncorrectable data error.

When an error is detected from read data in a high bandwidth memory (HBM) or the stacked memory structure, the error is an error occurring due to noise while data is transmitted through the TSV.

According to example embodiments, as illustrated in FIG. 22, the cell core ECC engine 722 may be included in the memory die, the via ECC engine 712 may be included in the buffer die. Accordingly, soft data fail maybe detected and corrected. The soft data fail may include a transmission error which is generated due to noise when data is transmitted through TSV lines.

Figure 23:
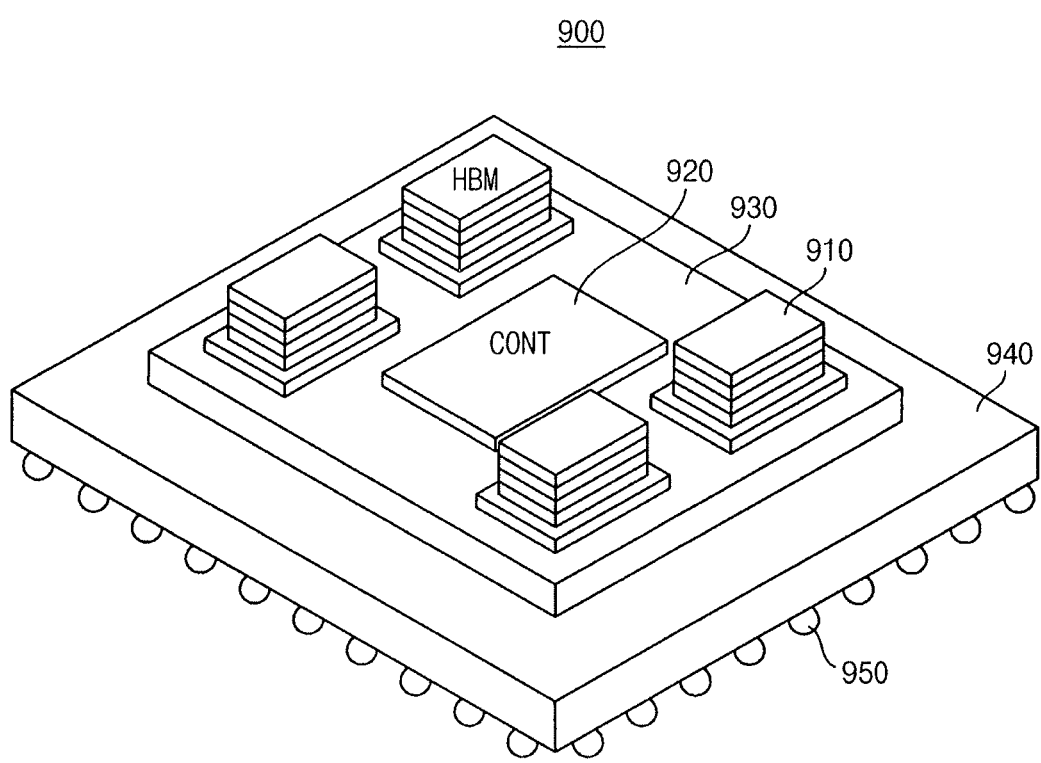
FIG. 23 illustrates a semiconductor package including the stacked memory device according to example embodiments.

FIG. 23 illustrates a semiconductor package including the stacked memory device according to example embodiments. Referring to FIG. 23, a semiconductor package 900 may include one or more stacked memory devices 910 and a memory controller 920.

The stacked memory devices 910 and memory controller 920 may be mounted on an interposer 930. The interposer 930 and the memory controller 920 may be mounted on a package substrate 940. The interposer 930 may include TSV, an embedded multi-die interconnect bridge (EMIB), e.g., an organic package substrate, in a non-TSV manner having a TSV form, or a printed circuit board (PCB) form. The memory controller 920 may communicate with the plurality of stacked memory devices 910.

The memory controller 920 may correspond to a semiconductor device which may perform a memory control function, and for example, memory controller 920 may be implemented as an application processor (AP).

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and the buffer die may include a DLL circuit.

For example, each of the stacked memory devices 910 and memory controller 920 may include a physical region, and communication may be performed between the stacked memory devices 910 and memory controller 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

According to example embodiments, divided clock signals are generated by dividing a reference clock signal, and a recovered clock signal is generated by compensating for skews between the divided clock signals through two duty cycle corrections. Therefore, the DLL circuit may prevent duty errors of the divided clock signals and the recovered clock signal while managing a frequency limit of a core circuit of the semiconductor memory device.

Embodiments may be applied to systems using semiconductor memory devices that employ dynamic memory cells and DLL circuit. For example, embodiments may be applied to systems, e.g., a smart phone, a navigation system, a notebook computer, a desk top computer, a game console, and the like, that use the semiconductor memory device as a working memory.

Some embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A delay-locked loop (DLL) circuit of a semiconductor memory device, the DLL circuit comprising:
   a first duty cycle corrector to adjust duties of at least some of first through fourth divided clock signals to provide first through fourth corrected clock signals, in response to a first correction code, wherein the first through fourth divided clock signals are generated based on a reference clock signal, have a phase difference of 90 degrees with respect to each other;
   a second duty cycle corrector to adjust delays of at least some of second through fourth delayed clock signals of first through fourth corrected clock signals to provide first through fourth source clock signals, in response to a second correction code, wherein the first through fourth delayed clock signals are generated by delaying the first through fourth corrected clock signals;
   a clock tree to provide the first through fourth source clock signals to an inside of the semiconductor memory device as first through fourth propagation clock signals;

a first duty cycle detector to detect a duty of the first propagation clock signal to generate a first sub correction code of the first correction code and to detect duties of first and second recovered clock signals to generate the second correction code, wherein the first and second recovered clock signals are recovered based on the first through fourth propagation clock signals; and a second duty cycle detector to detect a duty of the second propagation clock signal to generate a second sub correction code of the first correction code.

2. The DLL circuit as claimed in claim 1, further comprising:
a timing controller to control operations of the first duty cycle detector and the second duty cycle detector, and
wherein the first sub correction code is associated with the first divided clock signal and the second sub correction code is associated with the second divided clock signal.

3. The DLL circuit as claimed in claim 1, wherein:
a frequency of each of the first through fourth divided clock signals substantially corresponds to a half of a frequency of the reference clock signal; and
a frequency of each of the first and second recovered clock signals is substantially the same as a frequency of the reference clock signal.

4. The DLL circuit as claimed in claim 1, wherein the first duty cycle corrector is to:
adjust a slope of an edge of the first divided clock signal in response to the first sub correction code to provide the first corrected clock signal; and
adjust a slope of an edge of the second divided clock signal in response to the second sub correction code to provide the second corrected clock signal.

5. The DLL circuit as claimed in claim 4, wherein the first duty cycle corrector is to compensate for a skew between the first corrected clock signal and the second corrected clock signal by adjusting the slope of the edge of the first divided clock signal.

6. The DLL circuit as claimed in claim 1, wherein the second duty cycle corrector is to adjust a delay of the second delayed clock signal in response to the second correction code to provide the second source clock signal.

7. The DLL circuit as claimed in claim 6, wherein the second duty cycle corrector is to compensate for a skew between the first source clock signal and the second source clock signal by adjusting the delay of the second delayed clock signal.

8. The DLL circuit as claimed in claim 1, wherein the first duty cycle detector includes:
a charge pump to output a first pump voltage and a second pump voltage based on duties of the first and third propagation clock signals or duties of the first and third recovered clock signals;
a comparator to generate a comparison signal based on comparing levels of the first and second pump voltages; and
a counter to generate the first sub correction code or the second sub correction code by performing a counting operation based on the comparison signal.

9. The DLL circuit as claimed in claim 8, wherein the charge pump includes:
a first capacitor connected to a first node;
a second capacitor connected to a second node;
a first switch connected to the first node to control an electrical connection between the first node and a first input terminal of the comparator;

a second switch connected to the second node to control an electrical connection between the second node and a second input terminal of the comparator; and
a third switch to control an electrical connection between the first node and the second node.

10. The DLL circuit as claimed in claim 1, wherein the first duty cycle corrector includes first through fourth sub correctors, and
wherein the first sub corrector includes:
a first stage to receive the first divided clock signal and to adjust a slope of an edge of the first divided clock signal in response to a first inverted sub correction code to provide a first intermediate clock signal, wherein the first inverted sub correction code is generated by inverting the first sub correction code; and
a second stage connected to the first stage, the second stage to adjust a slope of an edge of the first intermediate clock signal in response to the first sub correction code to provide the first corrected clock signal.

11. The DLL circuit as claimed in claim 1, wherein the first duty cycle corrector includes first through fourth sub correctors, and
wherein the first sub corrector includes:
a first stage to receive the first divided clock signal and to adjust a slope of a rising edge and a slope of a falling edge of the first divided clock signal in response to the first sub correction code and a first inverted sub correction code to provide a first intermediate clock signal, wherein the first inverted sub correction code is generated by inverting the first sub correction code; and
a second stage connected to the first stage, the second stage to adjust a slope of a rising edge and a slope of a falling edge of the first intermediate clock signal in response to the first sub correction code and the first inverted sub correction code to provide the first corrected clock signal.

12. The DLL circuit as claimed in claim 1, wherein the second duty cycle corrector includes first through fourth sub correctors, and
wherein the second sub corrector includes:
a first stage to receive the second delayed clock signal and to adjust a delay of the second delayed clock signal in response to the second correction code and a second inverted corrected code to provide a first intermediate clock signal, wherein the second inverted correction code is generated by inverting the second correction code; and
a second stage connected to the first stage, the second stage to adjust a delay of the first intermediate clock signal in response to the second correction code and the second inverted correction code to provide the second source clock signal.

13. The DLL circuit as claimed in claim 1, further comprising:
a clock recovery circuit to generate the first and second recovered lock signals based on the first through fourth propagation clock signals.

14. The DLL circuit as claimed in claim 13, wherein the clock recovery circuit includes:
a first multiplexer to receive the first through fourth propagation clock signals to output a first selected clock signal enabled during a quarter period of the first propagation clock signal, in response to a first selection signal;
a second multiplexer to receive the first through fourth propagation clock signals to output a second selected clock signal enabled during a quarter period of the second propagation clock signal, in response to a second selection signal;

a third multiplexer to receive the first through fourth propagation clock signals to output a third selected clock signal enabled during a quarter period of the third propagation clock signal, in response to a third selection signal;

a fourth multiplexer to receive the first through fourth propagation clock signals to output a fourth selected clock signal enabled during a quarter period of the fourth propagation clock signal, in response to a fourth selection signal; and a fifth multiplexer to receive the first through fourth selected clock signal, and to alternately select the first selected clock signal and the third selected clock signal in response to a fifth selection signal to output the first recovered clock signal.

15. A semiconductor memory device, comprising:

a delay-locked loop (DLL) circuit to receive a reference clock signal, and to correct duty cycle errors of first through fourth divided clock signals to provide an output clock signal synchronized with the reference clock signal, the first through fourth divided clock signals being generated by dividing the reference clock signal;

a memory cell array including a plurality of dynamic memory cells; and a data input/output buffer to store data read from the memory cell array and to output the data in synchronization with the output clock signal, wherein the DLL circuit includes:

a first duty cycle corrector to adjust duties of at least some of the first through fourth divided clock signals to provide first through fourth corrected clock signals, in response to a first correction code, wherein the first through fourth divided clock signals have a phase difference of 90 degrees with respect to each other;

a second duty cycle corrector to adjust delays of at least some of second through fourth delayed clock signals of first through fourth corrected clock signals to provide first through fourth source clock signals, in response to a second correction code, wherein the first through fourth delayed clock signals are generated by delaying the first through fourth corrected clock signals;

a clock tree to provide the first through fourth source clock signals to an inside of the semiconductor memory device as first through propagation clock signals;

a first duty cycle detector to detect a duty of the first propagation clock signal to generate a first sub correction code of the first correction code and to detect duties of first and second recovered clock signals to generate the second correction code, wherein the first and second recovered clock signals are recovered based on the first through propagation clock signals; and a second duty cycle detector to detect a duty of the second propagation clock signal to generate a second sub correction code of the first correction code.

16. The semiconductor memory device as claimed in claim 15, wherein
the first sub correction code is associated with the first divided clock signal and the second sub correction code is associated with the second divided clock signal;

a frequency of each of the first through fourth divided clock signals substantially corresponds to a half of a frequency of the reference clock signal; and a frequency of each of the first and second recovered clock signals is substantially the same as a frequency of the reference clock signal.

17. The semiconductor memory device as claimed in claim 15, wherein:
the first duty cycle corrector is to adjust a slope of an edge of the first divided clock signal in response to the first sub correction code to provide the first corrected clock signal and to adjust a slope of an edge of the second divided clock signal in response to the second sub correction code to provide the second corrected clock signal; and the second duty cycle corrector is to adjust a delay of the second delayed clock signal in response to the second correction code to provide the second source clock signal.

18. The semiconductor memory device as claimed in claim 15, wherein the first duty cycle corrector includes first through fourth sub correctors, and
wherein the first sub corrector includes:
a first stage to receive the first divided clock signal and to adjust a slope of an edge of the first divided clock signal in response to a first inverted sub correction code to provide a first intermediate clock signal, wherein the first inverted sub correction code is generated by inverting the first sub correction code; and a second stage connected to the first stage, the second stage to adjust a slope of an edge of the first intermediate clock signal in response to the first sub correction code to provide the first corrected clock signal.

19. The semiconductor memory device as claimed in claim 15, wherein the second duty cycle corrector includes first through fourth sub correctors, and
wherein the second sub corrector includes:
a first stage to receive the second delayed clock signal and to adjust a delay of the second delayed clock signal in response to the second correction code and a second inverted corrected code to provide a first intermediate clock signal, wherein the second inverted correction code is generated by inverting the second correction code; and a second stage connected to the first stage, the second stage to adjust a delay of the first intermediate clock signal in response to the second correction code and the second inverted correction code to provide the second source clock signal.

20. A method of operating a delay-locked loop circuit in a semiconductor memory device, the method comprising:
generating first through fourth divided clock signals based on a reference clock signal, the first through fourth divided clock signals having a phase difference of 90 degrees with respect to each other;

detecting duties of first and second propagation clock signals based on the first and second divided clock signals to adjust slopes of edges of the first and second divided clock signals;

generating first and second recovered clock signals based on the first through fourth divided clock signals; and detecting a duty error of the first and second recovered clock signals to adjust a skew between the first and second divided clock signals.

* * * * *